US008350214B2

United States Patent
Otaki et al.

(10) Patent No.: US 8,350,214 B2
(45) Date of Patent: Jan. 8, 2013

(54) CHARGED PARTICLE BEAM APPLIED APPARATUS

(75) Inventors: Hiroki Otaki, Kyoto (JP); Momoyo Enyama, Kunitachi (JP); Hiroya Ohta, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/143,404

(22) PCT Filed: Jan. 4, 2010

(86) PCT No.: PCT/JP2010/000003
§ 371 (c)(1),
(2), (4) Date: Jul. 6, 2011

(87) PCT Pub. No.: WO2010/082541

PCT Pub. Date: Jul. 22, 2010

(65) Prior Publication Data

US 2011/0272576 A1    Nov. 10, 2011

(30) Foreign Application Priority Data

Jan. 15, 2009   (JP) ................................ 2009-006302

(51) Int. Cl.
*H01L 21/66*  (2006.01)
*G01N 23/225*  (2006.01)
(52) U.S. Cl. ........................................ 250/310; 250/311
(58) Field of Classification Search .................. 250/310, 250/311
See application file for complete search history.

(56) References Cited

U.S. PATENT DOCUMENTS

| | | | |
|---|---|---|---|
| 6,593,152 B2 * | 7/2003 | Nakasuji et al. ................ | 438/14 |
| 6,853,143 B2 * | 2/2005 | Nakasuji et al. ......... | 315/111.81 |
| 7,635,851 B2 * | 12/2009 | Fujita et al. ............. | 250/492.22 |
| 7,741,601 B2 * | 6/2010 | Noji et al. ..................... | 250/310 |
| 7,880,143 B2 * | 2/2011 | Tanimoto et al. ............ | 250/310 |
| 2004/0159787 A1 * | 8/2004 | Nakasuji et al. ............. | 250/311 |
| 2008/0067376 A1 | 3/2008 | Tanimoto et al. | |
| 2008/0230697 A1 * | 9/2008 | Tanimoto et al. ............ | 250/310 |
| 2009/0057577 A1 * | 3/2009 | Parker ...................... | 250/492.23 |
| 2010/0078556 A1 * | 4/2010 | Fujita et al. .................. | 250/310 |
| 2010/0133433 A1 * | 6/2010 | Tanimoto et al. ............ | 250/310 |
| 2011/0272576 A1 * | 11/2011 | Otaki et al. ................... | 250/306 |

FOREIGN PATENT DOCUMENTS

| | | |
|---|---|---|
| JP | 10-294345 A | 11/1998 |
| JP | 10-339711 A | 12/1998 |
| JP | 2007-317467 A | 12/2007 |
| JP | 2008-165990 A | 7/2008 |

* cited by examiner

*Primary Examiner* — David A Vanore
(74) *Attorney, Agent, or Firm* — Mattingly & Malur, PC

(57) ABSTRACT

Provided is a multi-beam type charged particle beam applied apparatus in an implementable configuration, capable of achieving both high detection accuracy of secondary charged particles and high speed of processing characteristically different specimens. An aperture array (111) includes plural aperture patterns. A deflector (109) for selecting an aperture pattern through which a primary beam passes is disposed at the position of a charged particle source image created between an electron gun (102), i.e., a charged particle source, and the aperture array (111). At the time of charge-control beam illumination and at the time of signal-detection beam illumination, an aperture pattern of the aperture array (111) is selected, and conditions of a lens array (112), surface electric-field control electrode (118) and the like are switched in synchronization with each beam scanning. Thus, the charges are controlled and the signals are detected at different timings under suitable conditions, respectively.

17 Claims, 15 Drawing Sheets

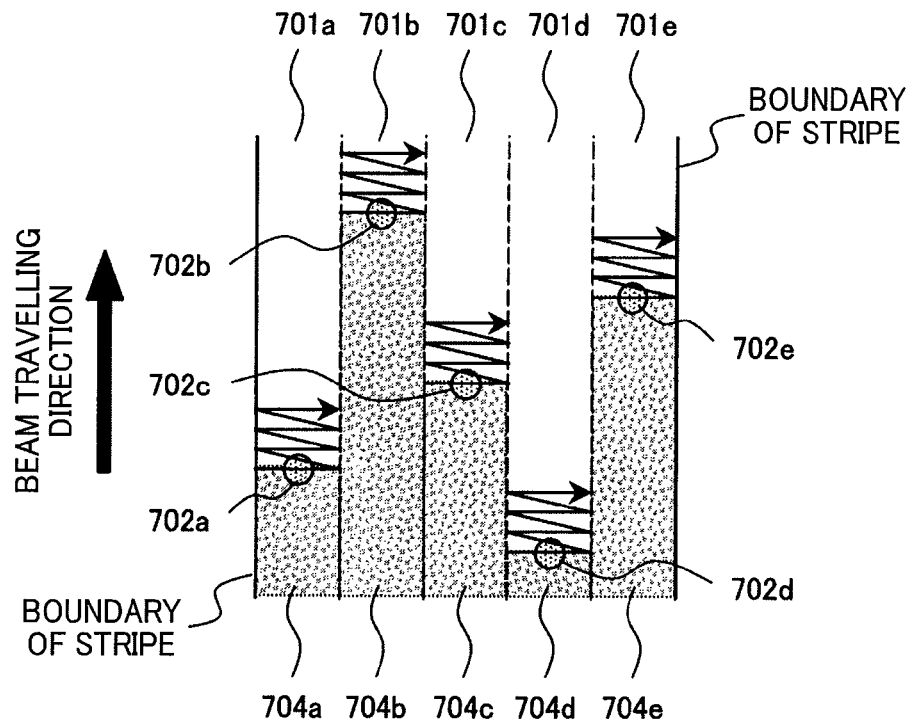
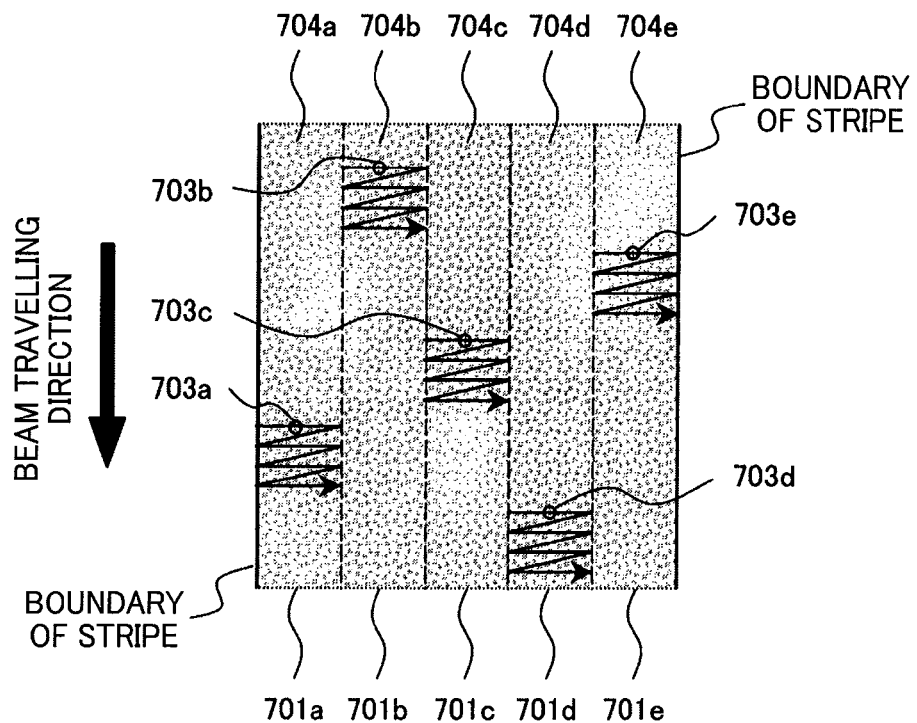

CHARGED PARTICLE BEAM APPLIED APPARATUS

TECHNICAL FIELD

The present invention relates to charged particle beam application technologies, and more particularly to charged particle beam applied apparatuses, such as inspection apparatuses and measurement apparatuses, used in manufacturing processes of semiconductors and magnetic disks.

BACKGROUND ART

In a process of manufacturing semiconductors or magnetic disks, use is made of a charged particle beam applied apparatus to perform measurement, defect review, inspection or the like of a specimen through observation that includes illuminating the specimen with a charged particle beam (hereinafter, referred to as a signal-detection beam), such as an electron beam and an ion beam, detecting produced secondary charged particles, such as secondary electrons, and performing arithmetic computations on signals obtained from the detected secondary charged particles.

Many of these charged particle beam applied apparatuses employ a technique of scanning a focused charged particle beam on a specimen; however, this technique requires a long time for inspecting the entire surface of the specimen, and therefore improvement of the specimen processing speed is an important issue. In order to resolve the issue, a multi-beam type charged particle beam applied apparatus has been proposed that simultaneously illuminates created multiple signal-detection beams, that is, multiple beams for signal detection, onto a specimen and detects secondary charged particle signals. Such a multi-beam type apparatus using multiple signal-detection beams can enhance the speed for processing the specimen in comparison with apparatuses using one signal-detection beam. For example, Patent Literature 1 proposes a multi-beam type charged particle beam applied apparatus in which a charged particle beam emitted from a charged particle source illuminates a plate (hereinafter referred to as an aperture array) with multiple apertures, the charged particle beam is split by the aperture array into multiple charged particle beams, and the individual split beams are focused by lenses aligned in an array (hereinafter referred to as a lens array).

In addition to the improvement of the specimen processing speed, these charged particle beam applied apparatuses are required, as an important issue, to improve the accuracy of defect detection and measurement in accordance with the increase in miniaturization and complexity of devices. The accuracy of defect detection and measurement depends on the detection accuracy of the secondary charged particles. Since the detection accuracy of the secondary charged particles is greatly influenced by the charge on the surface of the specimen, control of the charge on the surface of the specimen is critical to improve the accuracy of defect detection and measurement. For example, Patent Literature 2 proposes a charge controlling method in which a specimen is illuminated with an electron beam emitted from an electron source for pre-charge, which is separately provided from an electron source for signal-detection beams. However, an electron optical column provided with the electron source of signal-detection beams and an electron optical column provided with the pre-charge electron source have specified dimensions, respectively, that make it difficult to shorten the distance between the positions illuminated by the electron sources. The distance makes a fairly long time difference between the pre-charge beam illumination for controlling charge and the signal-detection beam illumination. Owing to the time difference, some specimens may not be able to maintain their charge provided by the pre-charge beam until the signal-detection beam illuminates the specimens.

In order to address the problems, Patent Literature 3 proposes a multi-beam type electron beam inspection apparatus that uses a part of produced multiple beams for controlling charge. In this method, a charge-control beam (primary charge-control beam) and a signal-detection beam (primary inspection beam) are simultaneously formed from an electron source by using an aperture array and lens array. The representations in the brackets are terms used in Patent Literature 3.

According to Patent Literature 3, in comparison with the method in which the pre-charge electron source is separately provided from the electron source for signal-detection beams, the positions illuminated by the charge-control beam and the signal-detection beam can be brought nearer to each other, thereby reducing time from the charge-control beam illumination to the signal-detection beam illumination. This time reduction allows the signal-detection beam to illuminate the specimen, which cannot hold the charge for a long time, before charge attenuation occurs, which improves inspection accuracy. In addition, in order to individually set the illumination conditions of the charge-control beam and signal-detection beam, electrodes used for controlling the charge are separately provided.

Citation List
Patent Literature
PTL 1: JP-A No. 2007-317467
PTL 2: JP-A No. Hei10 (1998)-294345
PTL 3: JP-A No. 2008-165990

SUMMARY OF INVENTION

Technical Problem

In the multi-beam type charged particle beam applied apparatus disclosed in Patent Literature 3, an aperture array has a single pattern of apertures arranged near the center of the electron optical system. Patent Literature 3 also proposes a method for allowing only desired beams to pass through by a beam selection mask, which has multiple aperture patterns, located downstream of the aperture array; however, the method has some problems, for example: parameters, which affect the charge control, including the beam current, the number of the beams and the time interval between the charge-control beam illumination and the signal-detection beam illumination, cannot be individually specified; and there is a limitation on the number of combinations of the conditions of the charge-control beam and signal-detection beam. In addition, it seems be difficult to separately install the electrodes and other related components for charge control for the purpose of individually setting the conditions of the charge-control beam and signal-detection beam from the viewpoint of the component size and withstand voltage of the components.

An object of the present invention is to provide an easily-implementable charged particle beam applied apparatus that can apply the charge-control beam and signal-detection beam under a number of separate conditions.

Solution to Problem

For the purpose of achieving the object, an aspect of the present invention provides a charged particle beam applied apparatus including: a charged particle source that produces charged particles; a primary electron optical system that includes an illumination-system separation unit separating the charged particles produced by the charged particle source into plural charged particle beams, one or more lenses used to apply the plural charged particle beams onto a specimen, and a scanning-beam deflector causing the plural charged particle beams to scan the specimen; a signal detecting unit that detects individual secondary charged particle beams produced at plural positions on the specimen by illuminating the specimen with the plural charged particle beams; a secondary electron optical system that guides the secondary charged particle beams to the signal detecting unit; a movable stage on which the specimen is mounted; and a control unit that controls the switching times of charge-control beam illumination and signal-detection beam illumination, the charge-control beam illumination carried out for negatively charging the specimen by illuminating the specimen with plural charge-control charged particle beams, and the signal-detection beam illumination carried out for detecting signals from the specimen by illuminating the specimen with plural signal-detection charged particle beams.

In addition, for the purpose of achieving the object, an aspect of the present invention provides a charged particle beam applied apparatus including: a charged particle source that produces charged particles; a primary electron optical system that includes an illumination-system separation unit separating the charged particles produced by the charged particle source into plural charged particle beams, one or more lenses used to apply the plural charged particle beams onto a specimen, and a scanning-beam deflector causing the plural charged particle beams to scan the specimen; a signal detecting unit that detects individual secondary charged particle beams produced at plural positions on the specimen by illuminating the specimen with the plural charged particle beams; a movable stage on which the specimen is mounted; a surface electric-field control unit that controls the surface electric field of the specimen; and a control unit that controls optical conditions of the first electron optical system and the surface electric-field control unit and controls the switching times of charge-control beam illumination and signal-detection beam illumination, the charge-control beam illumination carried out for charging the specimen by illuminating the specimen with plural charge-control charged particle beams, and the signal-detection beam illumination carried out for illuminating the specimen with plural signal-detection charged particle beams.

Furthermore, for the purpose of achieving the object, the present invention provides a charged particle beam applied apparatus including: a charged particle source that produces charged particles; an illumination-system separation unit that includes plural aperture patterns and separates the charged particles produced by the charged particle source into plural charged particle beams; a primary electron optical system that includes a pattern-selecting deflector applying the charged particles from the charged particle source to one of the plural aperture patterns, one or more lenses used to apply the plural charged particle beams onto a specimen, and a scanning-beam deflector causing the plurality of charged particle beams to scan the specimen; a signal detecting unit that detects individual secondary charged particle beams produced at plural positions on the specimen by illuminating the specimen with the plurality of charged particle beams; a secondary electron optical system that guides the secondary charged particle beams to the signal detecting unit; a movable stage on which the specimen is mounted; a surface electric-field control unit that controls the surface electric field of the specimen; and a control unit that controls optical conditions of the first electron optical system and the surface electric-field control unit and controls switching between charge-control beam illumination and signal-detection beam illumination, the charge-control beam illumination carried out for charging the specimen with plural charge-control charged particle beams, and the signal-detection beam illumination carried out for detecting signals from the specimen.

In the other words, the charged particle beam applied apparatus of the present invention does not include separate electrodes and other components dedicated to charge control, but carries out charge control and specimen observation at different timing by switching the conditions suitable for the charge control and specimen observation.

In addition, more preferably, the charged particle beam applied apparatus is provided with an aperture array and a lens array, both having multiple aperture patterns, and a deflector, which is used to select an aperture pattern, at the position of a charged particle source image created between the aperture array and the charged particle source. The conditions of the deflector and electrode for charge control are switched over in synchronism with scan signals to perform the charge control and specimen observation under optimal conditions.

ADVANTAGEOUS EFFECTS OF INVENTION

The present invention realizes an easily-implementable charged particle beam applied apparatus that can apply charge-control beams and signal-detection beams under a number of separate conditions.

BRIEF DESCRIPTION OF THE DRAWINGS

FIG. 10A illustrates a scanning operation by the charge-control beams in a third embodiment.

FIG. 10B illustrates a scanning operation by the signal-detection beams in the third embodiment.

DESCRIPTION OF EMBODIMENTS

Detailed descriptions about embodiments of the present invention will be made below with reference to the drawings. Through all the drawings describing the embodiments, like components are in principle denoted by like numerals and will not be further explained. The following embodiments will present an apparatus for inspecting semiconductors with electron beams; however, even if the apparatus uses ion beams, is used for inspecting magnetic disks as a specimen, or is a measurement apparatus, the effect of the present invention remains the same.

Embodiment 1

Described in the first embodiment is a multi-beam type scanning electron microscope including an aperture array and a lens array, both having multiple aperture patterns, further including a deflector that is disposed at the position of an electron source image above the aperture array and selects an aperture pattern, and changing the temporal timing between pre-charge and inspection. Thus configured apparatus realizes: with an easily-implementable configuration, change/switch of the timing between charge-control beam illumination and signal-detection beam illumination and reduction of time difference from the charge-control beam illumination to the signal-detection beam illumination to control charge and detect signals under optimal conditions, thereby improving defect detection sensitivity.

Figure 1:
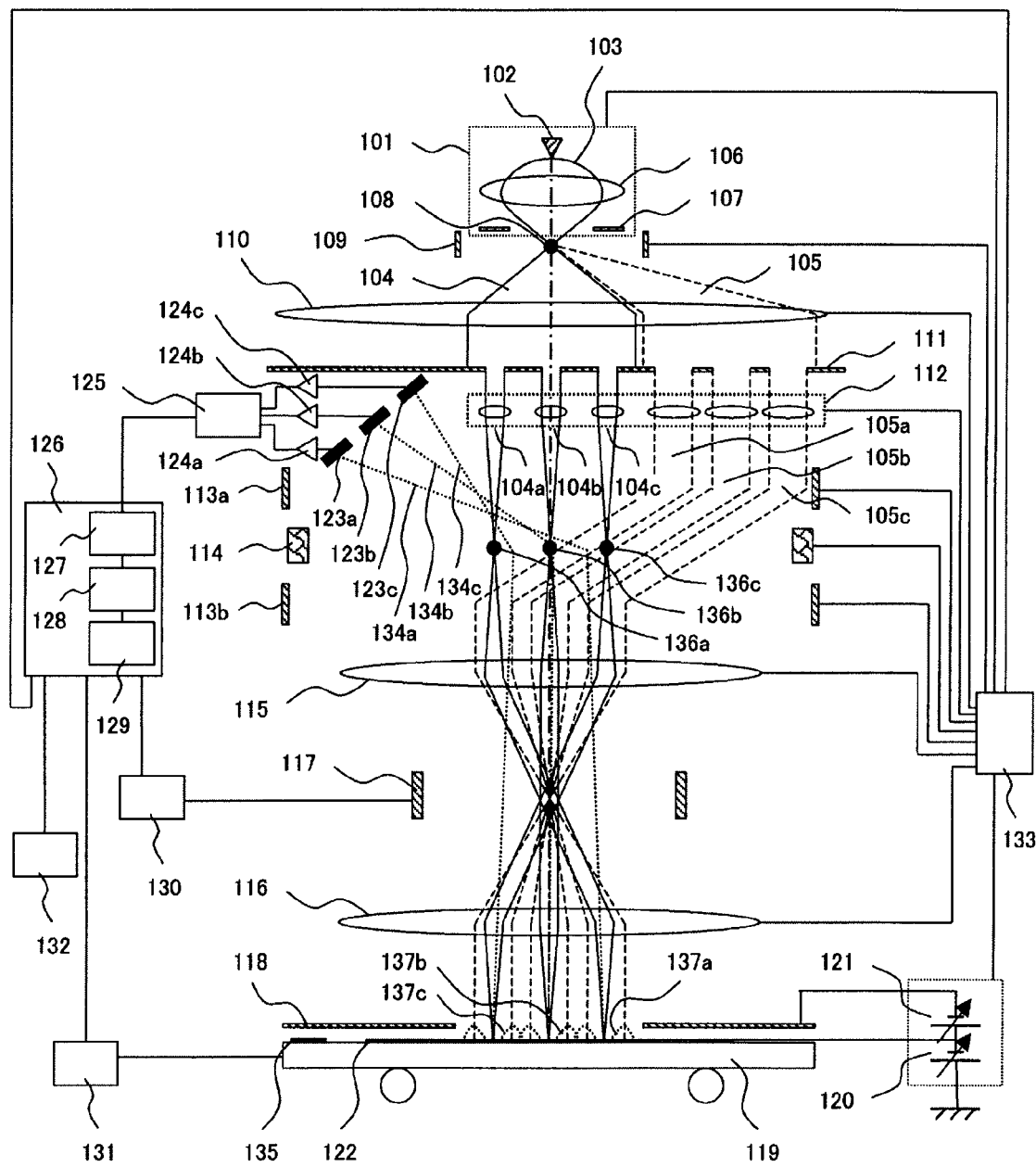
FIG. 1 is a schematic diagram of an electron beam inspection apparatus for describing a first embodiment.

FIG. 1 is a schematic diagram of an electron beam inspection apparatus according to Embodiment 1. First of all, the configuration of the apparatus will be described. An electron gun 101 includes an electron source 102 made of a material with a low work function, an anode 107 with a high potential relative to the electron source 102, and a magnetic lens 106 that superimposes a magnetic field on an accelerating electric field formed between the electron source 102 and anode 107. The electron source in this embodiment is a schottky-type electron source that readily provides a large amount of electric current and stably emits electrons. In the downstream direction in which a primary beam 103 is led out from the electron gun 101, as shown in FIG. 1, arranged are a magnetic lens 110, an aperture array 111 that has multiple aperture patterns in one plane and functions as an illumination-system separation unit, a lens array 112 with multiple aperture patterns, charge-control deflectors 113a, 113b serving as second deflectors, a beam separator 114 making up a secondary electron optical system, a magnetic lens 115, an objective lens 116, a deflector for deflecting a scanning beam (scanning-beam deflector) 117, a stage 119, secondary electron detectors 123a, 123b, 123c and some other components.

In this embodiment, the charge-control deflectors 113a, 113b are placed to form a two-tiered structure; however, a single tire structure is acceptable. In addition, a pattern-selecting deflector 109, which serves as a first deflector for selecting an aperture pattern of the aperture array, is disposed between the electron gun 101 and magnetic lens 110. Furthermore, the electron optical system includes a current-regulating aperture, an aligner for adjusting the central axis (optical axis) of primary beams, an aberration corrector and some other components (not shown).

The stage 119 moves with a wafer 122 mounted thereon. A surface electric-field control electrode 118 is disposed on the side of the electron gun with respect to the wafer 122 and is connected to a surface electric-field control power supply 121. Note that the surface electric-field control electrode 118 and surface electric-field control power supply 121 are sometimes collectively called a surface electric-field control unit. The wafer 122 is applied with a negative voltage as will be described later. Although a retarding power supply 120 in the drawing looks as if it is wired to the wafer 122, a wafer holder (not shown) is actually interposed between the wafer 122 and stage 119 while maintaining continuity therebetween. The retarding power supply 120 is connected to the wafer holder to apply a desired voltage to the wafer holder and wafer 122 and therefore does not cause wafer damage derived from direct wiring and physical contact with the wafer. The scanning-beam deflector 117 is connected to a scanning signal generation device 130 that is connected to a system controller 126 functioning as a control unit.

The electron gun 101, pattern-selecting deflector 109, magnetic lens 110, lens array 112, charge-control deflectors 113a, 113b, beam separator 114, magnetic lens 115, objective lens 116, retarding power supply 120 and surface electric-field control power supply 121 are connected to an electron optical system control circuit 133 that is connected to the system controller 126. The stage 119 is connected to a stage control device 131 that is connected to the system controller 126. The secondary electron detectors 123a, 123b, 123c serving as a signal detecting unit are connected to the system controller 126 via amplifier circuits 124a, 124b, 124c and an A/D converter 125. A storage section 127, an operating section 128 and a defect determination section 129 are disposed in the system controller 126 that is connected to an image display device 132. The storage section 127 includes a primary storage part enabling high-speed transmission and reception of signals with the system controller 126.

Note that the system controller 126 and electron optical system control circuit 133 are sometimes collectively called a control unit in this description. The system controller 126 can be implemented by a computer system, such as a personal computer (PC), having a memory functioning as the storage section 127, a central processing unit (CPU) functioning as the operating section 128 and defect determination section 129 and an input-output interface which is not shown in the drawings. The image display device 132 can be a display device included with the PC. It is needless to say that the electron optical system control circuit 133 can be a dedicated circuit, software program or some other components that perform control actions according to instructions provided by the system controller 126.

Although it is not illustrated in FIG. 1, all elements, except for those relating to the control system and circuitry, are obviously enclosed in a vacuum container and operate in an evacuated environment. It is also needless to say that a wafer transfer system is provided to carry the wafer outside the vacuum environment onto the stage.

On the stage 119 provided is a reference mark 135 used to adjust the values of current and voltage (electron optical system conditions) of the magnetic lens 106, pattern-selecting deflector 109 serving as a first deflector, magnetic lens 110, lens array 112, charge-control deflectors 113a, 113b serving as second deflectors, beam separator 114, magnetic lens 115, objective lens 116, retarding power supply 120, surface electric-field control power supply 121 and so on.

Next, the operations of the apparatus in this embodiment at the time of emission of signal-detection beams will be described in detail. A primary beam 103 emitted from the electron source 102 is accelerated in the direction of the anode 107 while being subjected to convergence effect by the magnetic lens 106 and forms a first electron source image (a point in which the beam size becomes the smallest) 108. Though not shown in FIG. 1, the electron gun 101 includes an aperture, as often seen in typical electron guns, so that an electron beam within a desired current range passes through the aperture. The primary beam passing through the aperture can be adjusted to have a desired current amount by changing the operational conditions of the anode 107 and magnetic lens 106. In addition, though not shown in FIG. 1, an aligner that corrects the optical axis of the primary beam 103 is disposed between the electron gun 101 and pattern-selecting deflector 109, thereby correcting the central axis of the electron beam deviated from the aperture or electron optical system.

The pattern-selecting deflector 109 is located at the position of the first electron source image 108 of the primary beam 103. The pattern-selecting deflector 109 serving as a first deflector in this embodiment is an electrostatic deflector. In this embodiment, the pattern-selecting deflector 109 is not used to illuminate signal-detection beams. Due to the disuse of the pattern-selecting deflector 109, the primary beam 103 emitted from the electron source 102 does not receive deflection effect, but turns into a signal-detection beam 104 that then enters the magnetic lens 110. The magnetic lens 110 aligns the primary beam so as to be in parallel with the optical axis. The primary beam in parallel with the optical axis passes through the aperture array 111. In this embodiment, the aperture array 111 has multiple aperture patterns; some have a single aperture and some have multiple apertures.

Figure 2:
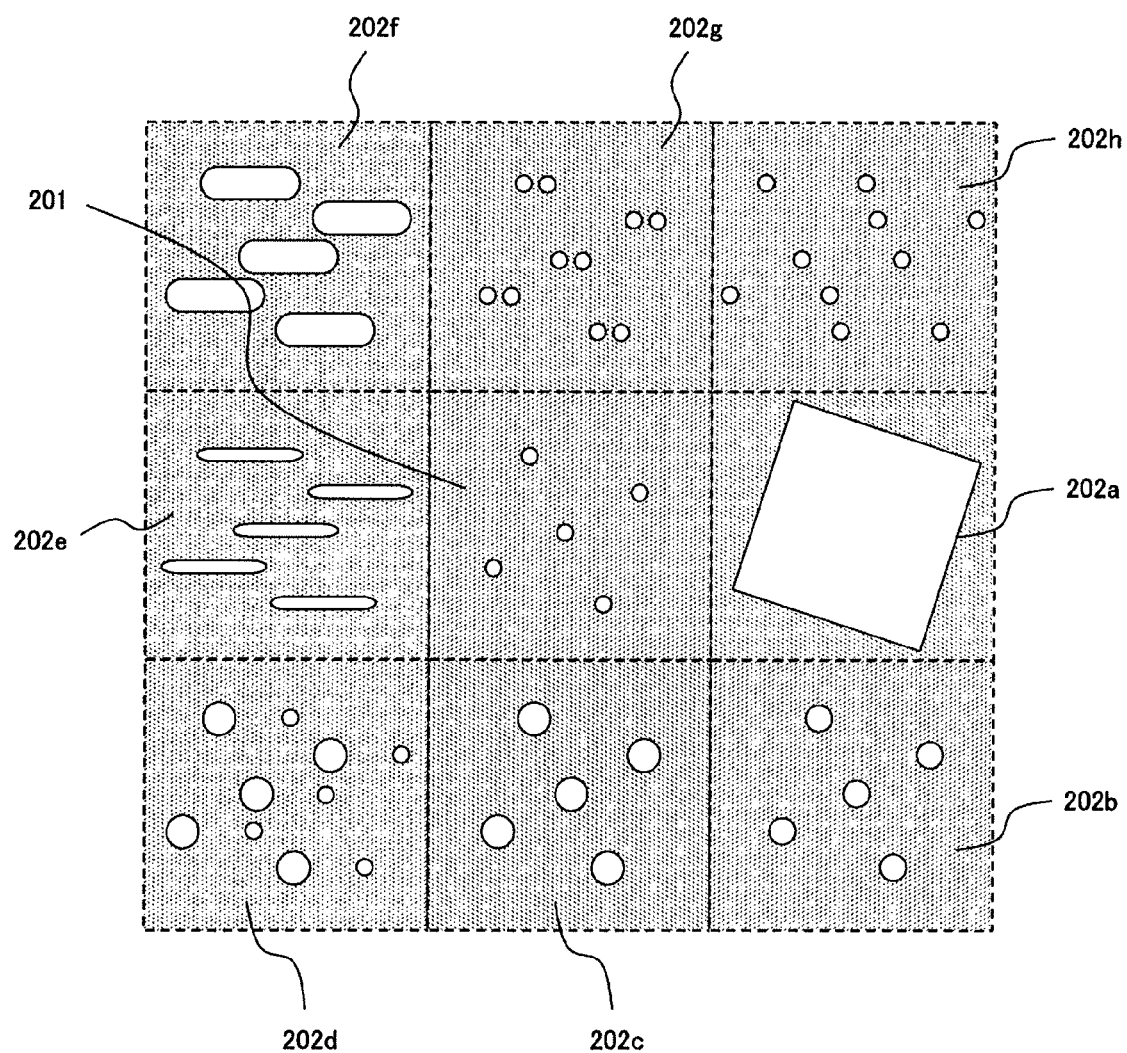
FIG. 2 is a diagram showing the arrangement of apertures of an aperture array according to the first embodiment.

FIG. 2 shows exemplary patterns of the aperture array 111 of this embodiment. An aperture pattern 201 at the center is a pattern for forming signal-detection beams, while the aperture patterns 202a to 202h surrounding the aperture pattern 201 are patterns for forming charge-control beams. The signal-detection beam forming pattern 201 is selected to apply signal-detection beams. The signal-detection beam 104 passes through the aperture pattern 201 at the center of the aperture array and is split into signal-detection beams 104a, 104b and 104c. In this embodiment, as shown in FIG. 2, the number of multi-beams to be formed is set to five; however, the number of beams does not affect the effectiveness of the present invention. For the purpose of illustrative convenience, FIG. 1 shows representative three beams out of five formed beams.

The lens array 112 is disposed at the downstream of the aperture array 111. The lens array 112 individually focuses the signal-detection beams 104a, 104b, 104c split by the aperture array 111 to form multi-beams. The lens array 112 can be a lens array that includes three electrodes each having multiple aperture patterns and acts as an Einzel lens for the primary beam passing through the apertures by applying a voltage to the center electrode.

The signal-detection beams 104a, 104b, 104c pass through the beam separator 114. In this embodiment, employed as the beam separator 114 is a Wien filter that produces a magnetic field and electric field orthogonal to each other in a plane perpendicular to the incident direction of the primary beam and deflects the electrons passing therethrough at an angle in accordance with the energy of the electron. In this embodiment, the beam separator adjusts the strength of the magnetic field and electric field so as to control the primary beam to travel in a straight line and to control the secondary electron beam incident from the opposite direction to deflect at a desired angle. The beam separator 114 is located at the level of the second electron source images 136a, 136b, 136c of the signal-detection beams 104a, 104b, 104c to reduce the effect of the aberration upon the primary beam. The magnetic lens 115 and objective lens 116 are magnetic lenses used to project the second electron source images 136a, 136b, 136c. Although the images are designed to be projected at unity magnification in FIG. 1, the images can be projected at a larger or smaller scale.

In this embodiment, the scanning-beam deflector 117 is an electrostatic octopole-type deflector located between the magnetic lens 115 and objective lens 116. When a signal is input to the scanning-beam deflector 117 from the scanning signal generation device 130, beams passing through the deflector are deflected in the same direction and at the same angle and raster-scan the top of the wafer 122 which is a specimen. The retarding power supply 120 applies a negative voltage to the wafer 122 to form an electric field that retards the primary beam in the vicinity of the surface of the wafer. As with the other optical elements, i.e., the electron gun 101, magnetic lens 110, lens array 112, beam separator 114, magnetic lens 115 and objective lens 116, the surface electric-field control power supply 121 and retarding power supply 120 are subject to cauterized control by the system controller 126 via the electron optical system control circuit 133.

The stage 119 is controlled by the stage control device 131. The system controller 126 controls over the scanning signal generation device 130 and stage control device 131 to examine a predetermined area on the wafer 122 on a stripe-by-stripe basis in the direction in which the stage travels. In the inspection apparatus of the embodiment, the stage continuously travels. The combination of the beam-scanning and the stage-traveling enables control of the primary beam to successively scan strip-shaped regions. These strip-shaped regions are prepared by dividing a predetermined area to be examined. Scanning the multiple strip-shaped regions results in scanning the entire predetermined area to be examined. Each of the strip-shaped regions is referred to as a stripe.

Figure 3A:
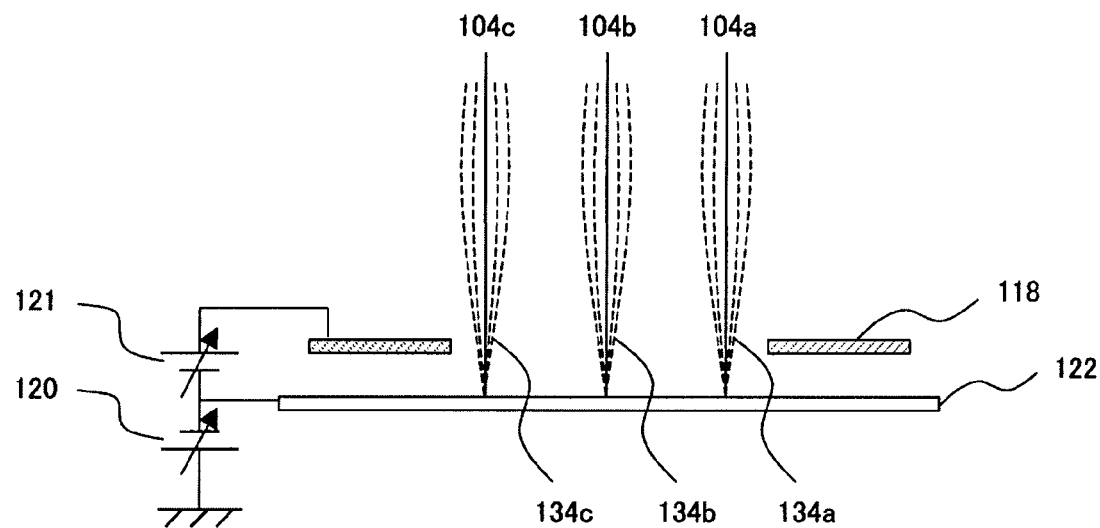
FIG. 3A shows a surface electric-field control electrode and a wafer when the electron beam inspection apparatus according to the first embodiment illuminates the wafer with signal-detection beams.
Figure 3B:
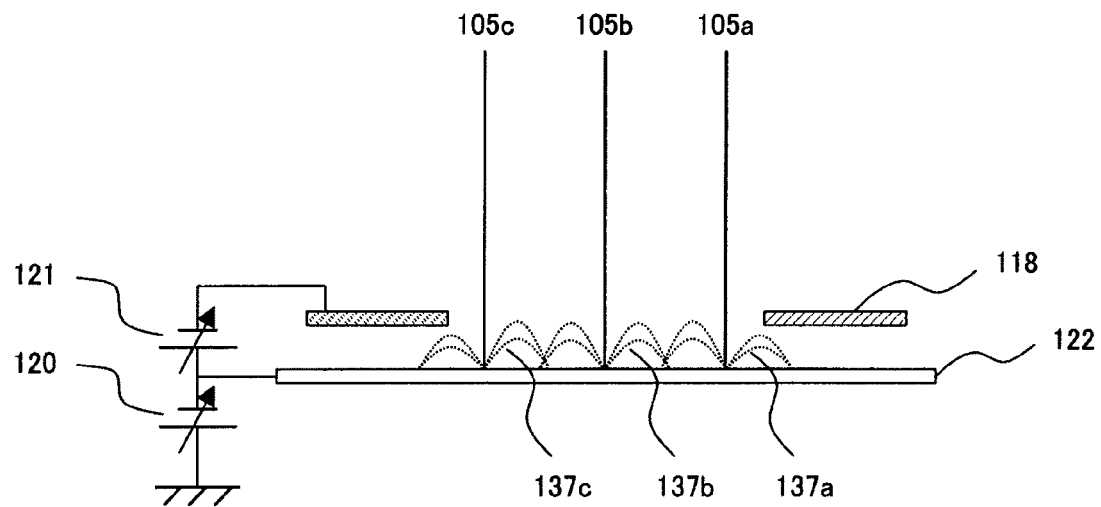
FIG. 3B shows the surface electric-field control electrode and the wafer when the electron beam inspection apparatus according to the first embodiment illuminates the wafer with charge-control beams.

With reference to FIGS. 3A and 3B, the action of the surface electric-field control electrode 118 of the embodiment when signal-detection beams are applied will be described. FIGS. 3A and 3B show only the wafer 122, surface electric-field control electrode 118, retarding power supply 120 and the surface electric-field control power supply 121 in the apparatus of FIG. 1. Even though FIGS. 3A and 3B schematically show as if the retarding power supply 120 is wired with the wafer 122 as with FIG. 1, the voltage is actually applied via a wafer holder (not shown) being electrically connected to the wafer 122, and therefore the wafer does not suffer direct damage caused by direct wiring or physical contact.

As described above, a negative voltage is applied to the wafer 122 from the retarding power supply 120 to retard the primary beams. The electric field generated by the voltage has an acceleration effect on secondary electrons traveling from the wafer toward the electron source in the direction opposite to the primary beams. The behavior of the secondary electrons generated from the wafer 122 illuminated by the primary beam is determined by the balance between the acceleration action and the action by potential difference between the surface electric-field control electrode 118 and wafer 122 (surface electric field strength).

When signal-detection beams are applied in this embodiment, as shown in FIG. 3A, the surface electric-field control electrode 118 is set to have a potential difference of +V relative to the wafer 122, where V≧0. This forms an electric field in regions illuminated with the signal-detection beams 104a, 104b and 104c; the electric field allowing the secondary electrons 134a, 134b, 134c generated from the wafer 122 to accelerate toward the electron gun. As a result, the secondary electrons 134a, 134b, 134c travel upwardly.

The behavior of the secondary electrons 134a, 134b, 134c afterward will be described using FIG. 1 again. The secondary electrons 134a, 134b, 134c travel toward the electron gun while being subjected to convergence effect by the magnetic lens 115 and objective lens 116, are separated from the trajectory of the primary beam by the beam separator 114 providing deflection effect on the secondary electrons 134a, 134b, 134c, and reach the secondary electron detectors 123a, 123b, 123c. The detected signals are amplified by the amplifier circuits 124a, 124b, 124c, are digitalized by the A/D converter 125, and are temporarily stored in the storage section 127 in the system controller 126 as image data. Subsequently, the operating section 128 performs calculations of various image statics, and in the end, the defect determination section 129 determines the presence or absence of defects based on the previously obtained defect determination criteria. The determination results are displayed on the image display device 132.

Next, the operations of the apparatus at the time of emission of charge-control beams will be described in detail. Firstly, as with the case of the signal-detection beam emission, a primary beam 103 emitted from the electron source 102 forms a first electron source image 108 and passes through the pattern-selecting deflector 109. For applying the charge-control beams, one of the aperture patterns 202a to 202h shown in FIG. 2 is selected and the pattern-selecting deflector 109 deflects the primary beam so that the primary beam enters the selected aperture pattern. The primary beam 103 subjected to the deflection effect turns into a charge-control beam 105. The charge-control beam 105 passes through the pattern selected from the aperture patterns 202a to 202h of the aperture array 111 and is split into charge-control beams 105a, 105b, 105c.

The selection of an aperture pattern, through which the primary beam passes, of the aperture array can be made by setting the deflection amount provided by the pattern-selecting deflector 109 to an appropriate value. Each aperture pattern has an aperture or apertures different in shape, number and size as will be described later. Selection from the aperture patterns 202a to 202h can change the conditions for applying the charge-control beams 105a, 105b, 105c.

Parameters for determining the conditions for controlling charge include the probe beam current, landing energy of the beams, the number of times of illumination, the duration of illumination, the illuminated area, surface electric field strength and so on. In the case where the beams are applied at multiple times, the time interval between illuminating operations is added to the parameters. Among these parameters, the probe beam current, the number of times of illumination, illuminated area, duration of illumination, and time interval between illuminating operations in the case where the beams are applied multiple times, and so on change according to the aperture patterns of the aperture array.

Aperture size and shape influence the probe beam current, illuminated area, duration of illumination and other parameters. Change in aperture size changes the amount of electrons passing therethrough, thereby changing the probe beam current. In addition, change in strength of convergence effect of the lens array 112 changes the area to be illuminated. The convergence effect of the lens array 112 will be described later. Furthermore, change in travelling speed of the stage 119 changes the duration of illumination.

The number of apertures influences the number of times of illumination, while the space between the apertures in combination with the travelling speed of the stage 119 influences the time interval between illuminating operations. Controlling these parameters can realize various charge states.

The following is a description about the aperture patterns of the embodiment. If an aperture pattern 202a is selected, charge control is made at one time with a single beam having an area large enough to cover an area illuminated by multiple signal-detection beams. Since the area is far larger than the area illuminated by the signal-detection beam, nonuniform charge distributions caused by charge leakage from the edge of the charged area to the surroundings can be reduced. Aperture patterns 202b, 202c have apertures larger in size than those of the aperture pattern 201 used for forming signal-detection beams, and therefore can change the probe beam current of the charge-control beam. Aperture patterns 202d, 202g, 202h have ten apertures in comparison with five apertures of the aperture pattern 201 used for forming the signal-detection beams. With these patterns, each charge-control beam can be applied two times for a single signal-detection beam, thereby forming a highly charged state. The aperture patterns 202g and 202h have the same apertures in size, but the aperture pattern 202h has apertures more widely spaced in comparison with those of the aperture pattern 202g. Selecting the aperture pattern 202h with the widely spaced apertures can prolong the time interval between the first illumination and the second illumination of the charge-control beams compared with the selection of the aperture pattern 202g. In addition, the aperture pattern 202d includes two sizes of apertures and allows the charge-control beams to be applied under the different conditions from the first to the second illumination. Aperture patterns 202e and 202f include five elliptic apertures. Compared with the aperture patterns having circle apertures, the elliptic apertures prolong the duration of illumination per an illumination point on the wafer, thereby forming a highly charged state compared with the aperture patterns 202g and 202h. For the purpose of making the charge state at the positions to be illuminated by the five signal-detection beams uniform, the aperture patterns 202a to 202h used to form the charge-control beams are in phase with the aperture pattern 201 used to form the signal-detection beams.

The aperture patterns described above are just examples, and the shapes of the aperture patterns of the aperture array 111 and the combinations thereof do not need to be limited to those in the embodiment. Although this embodiment shows the five multi-beams, it is needless to say that the number of the apertures of the aperture array varies according to the number of multi-beams.

The charge-control beams 105a, 105b, 105c, which were split by the aperture array 111, are individually focused by the lens array 112. It is not necessary for the focusing level to be the same as that of the signal-detection beams, but adjustment of the focusing level can change the spread level of the charge-control beams 105a, 105b, 105c on the specimen. For example, if the lens array 112 is set not to exert its activity, the charge-control beams 105a, 105b, 105c do not receive the focusing effect and turn into beams large in area.

The charge-control beams 105a, 105b, 105c having passed through the lens array 112 are deflected by the charge-control deflectors 113a, 113b and are applied onto the specimen so as to cover the area to be illuminated by the signal-detection beams 104a, 104b, 104c. The beams having passed through the charge-control deflectors 113a, 113b pass through the beam separator 114 and magnetic lens 115 and are deflected by the scanning-beam deflector 117 to raster-scan the wafer 122 as does the signal-detection beams 104a, 104b, 104c. The system controller 126 and stage control device 131 control the charge-control beams 105a, 105b, 105c in the same manner as done for the signal-detection beams.

With reference to FIGS. 3A and 3B, the action of the surface electric-field control electrode 118 when charge-control beams are applied will be described. As described above, the behavior of the secondary electrons is determined by the balance between a voltage applied to the wafer 122 and potential difference V applied to the surface electric-field control electrode 118 with respect to the wafer 122. A desired charge state can be created by adjusting the potential difference V when charge-control beams illuminate. When $V \geqq 0$ (FIG. 3A), as described with the illumination conditions of the signal-detection beams, the secondary electrons generated from the wafer 122 travel upwardly. This can make the wafer 122 positively charged. On the other hand, when V<0 (FIG. 3B), an electric field that pulls back the secondary electrons 137a, 137b, 137c generated from the wafer 122 to the wafer 122 is created at the regions illuminated by the charge-control beams 105a, 105b, 105c. The electric field effect pulls the secondary electrons 137a, 137b, 137c back to the wafer 122, thereby making the wafer 122 negatively charged. The surface electric-field control electrode 118 regulates the amount of the secondary electrons returning to the wafer to control the charge state of the wafer.

In this embodiment, the above-described signal-detection beam and charge-control beam are alternatively applied with switchover between their conditions. Scanning operations with the primary beam by the scanning-beam deflector 117 and the timing of switching between the illumination conditions of the signal-detection beams and charge-control beams will be described later.

Next, a procedure for inspecting a circuit pattern formed on a wafer by using the electron beam inspection apparatus according to the embodiment will be described with reference to FIGS. 1, 4, 5 and 6.

Figure 4:
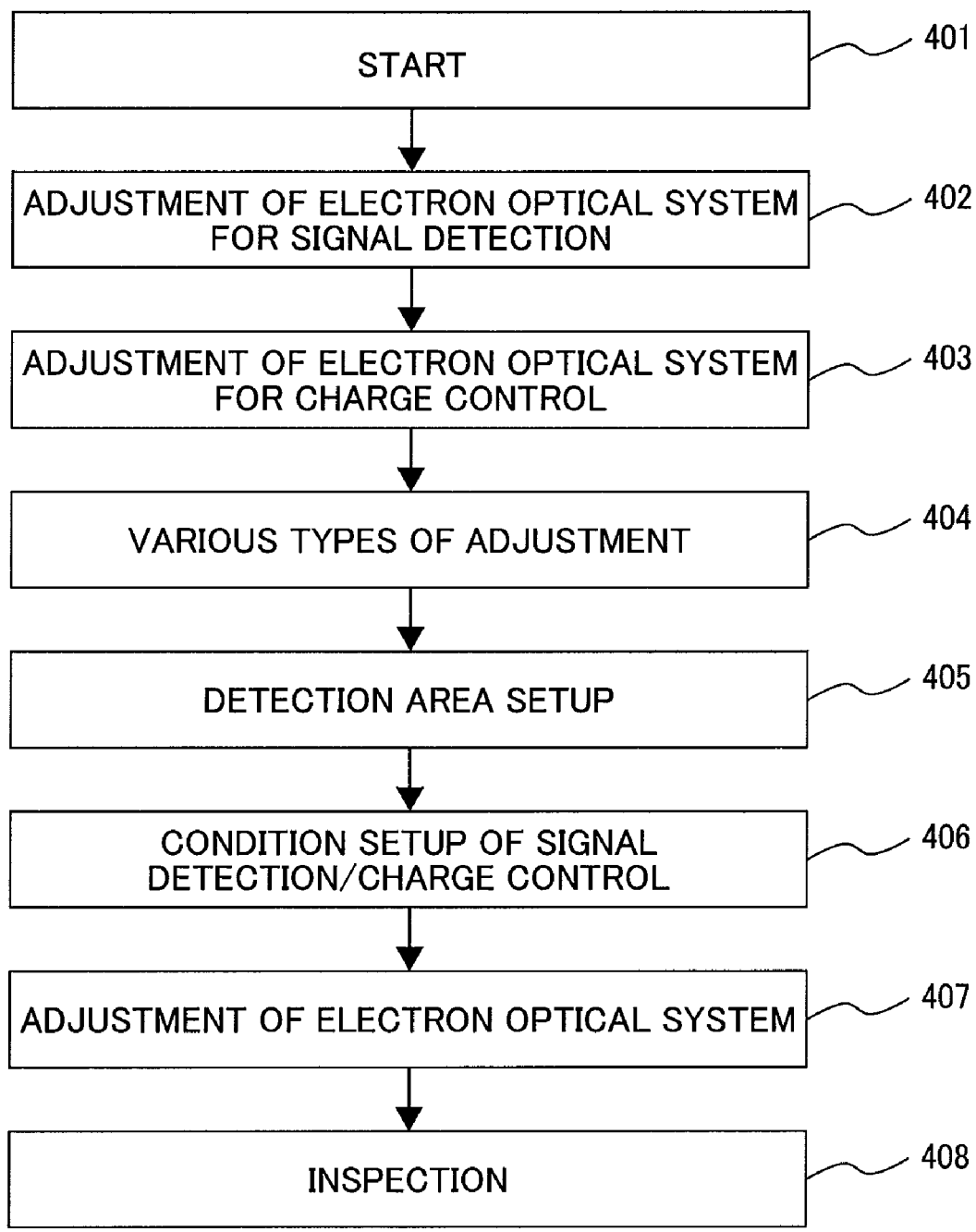
FIG. 4 describes an inspection procedure in the first embodiment.

FIG. 4 is a flow chart showing the inspection procedure. When an operator clicks a start button appearing at first on an image display device 132 in FIG. 1, the system controller 126 sends an instruction to the stage control device 131 to mount a wafer to be inspected on a stage (step 401).

The system controller 126 then uses the electron optical system control circuit 133 to make adjustments of the electron optical system for signal-detection beams (step 402). The operator adjusts the current values and voltage values of various optical elements, including the magnetic lens 106, retarding power supply 120, surface electric-field control power supply 121, objective lens 116, aberration corrector (not shown), aligner (not shown) through a graphic user interface (GUI) on the screen of the image display device 132 so as to obtain a desired value of the landing energy of the signal-detection beams, probe beam current, surface electric field strength, beam size and deflection amount, and stores the values in a condition file stored in the storage section 127. In this step, the operator can select a condition file with conditions already entered in the storage section 127 to rewrite it if necessary, or can select to create a new condition file and enters signal detection conditions based on default values.

Next, in accordance with the instruction from the system controller 126, the electron optical system control circuit 133 adjusts the electron optical system for charge control (step 403). In this adjustment, the deflection amount applied by the pattern-selecting deflector 109 is adjusted so that the area illuminated by the charge-control beams includes the area illuminated by the signal-detection beams 104a, 104b, 104c, and the illumination conditions of the charge-control beams 105a, 105b, 105c is adjusted.

Figure 5:
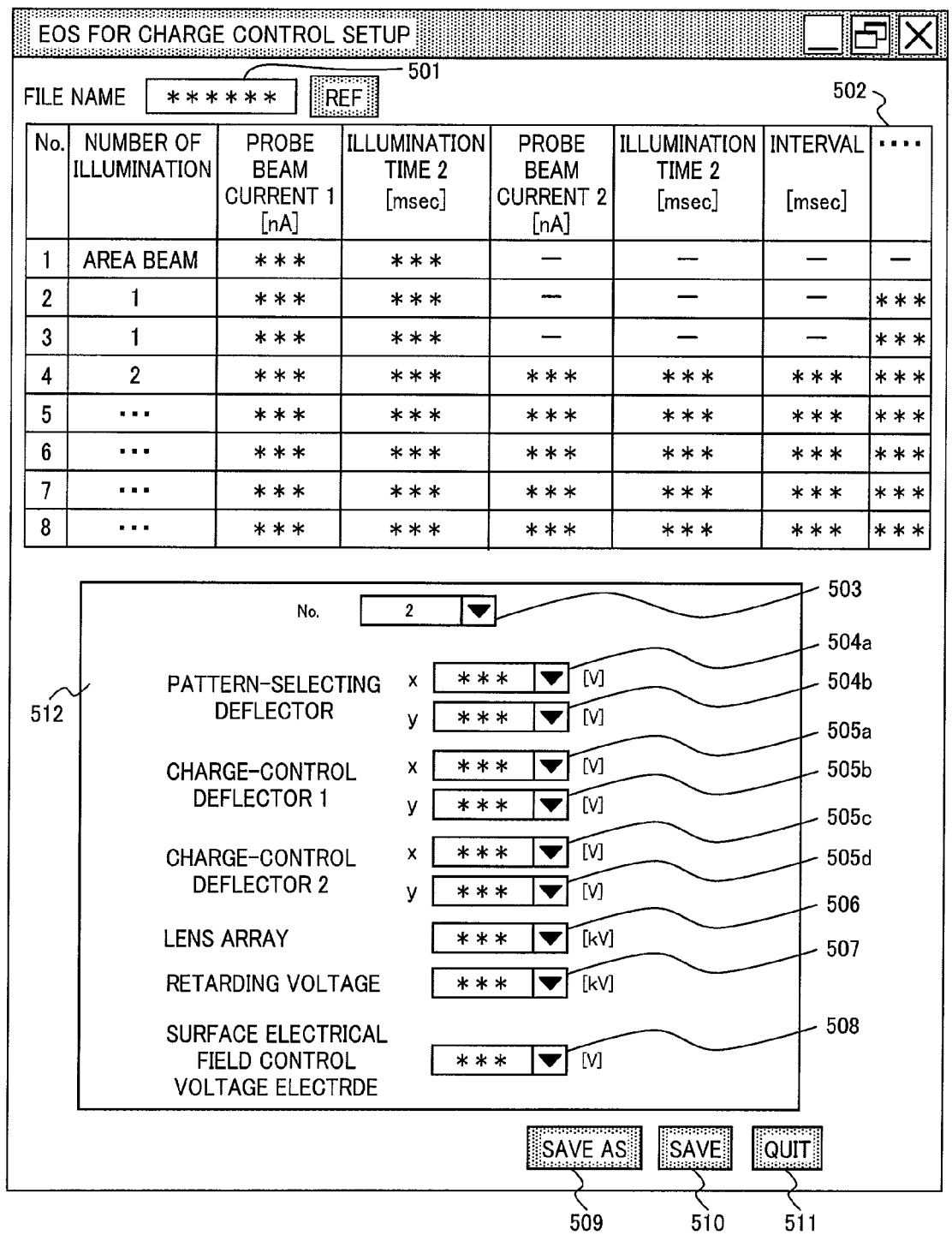
FIG. 5 illustrates a charge-control EOS setup window in the first embodiment.

FIG. 5 shows a GUI on the screen of the image display device 132 in step 403 and an exemplary window for setting the electron optical system used for charge control. The aperture patterns 202a to 202h of the aperture array 111 correspond to numbers, and parameters, such as the number of apertures, aperture shape and aperture size, are registered in advance in the storage section 127 in the system controller 126. Before the adjustment, the parameters, such as the number of times of illumination, probe beam current, duration of illumination and time interval between illuminating operations in the case where beams are applied multiple times, are calculated based on the registered parameters, previously set parameters and so on, and displayed on an aperture-array-condition setup field 502 on the setup window.

The operator can select a condition file, with electron optical conditions for charge control already entered, through a condition-file specification box 501 and overwrite the file if necessary, or can select to create a new file and enter conditions based on default values. The operator selects charge-control beam conditions used to form charge-control beams 105a, 105b, 105c through an illumination-condition selection box 503 by referring to the conditions displayed in the aperture-array-condition setup field 502 on the screen of the image display device 132. Subsequently, the operator inputs values into pattern-selecting-deflector setup boxes 504a, 504b and charge-control-deflector setup boxes 505a to 505d to adjust the illumination positions where the charge-control beams 105a, 105b, 105c strike. In addition, the operator changes the values in a lens-array setup box 506, retarding-voltage setup box 507 and surface-electrical-field control-voltage setup box 508 through a charge-control-beam illumination-condition setup field 512 on the image display device 132 to adjust the area on the wafer illuminated by the charge-control beams 105a, 105b, 105c, landing energy of the charge-control beams and the amount of the secondary electrons returning to the wafer 122.

After the adjustment operation with the selected conditions is completed, the operator clicks a save button 510 or a save-as button 509 to store the conditions displayed in the charge-control-beam illumination-condition setup field 512 into the storage section 127. At last, the operator clicks a quit button 511 to complete the setup of the electron optical conditions for charge control.

The operator then makes adjustments of conditions other than those for the electron optical system, e.g., conditions for the detection system and alignment, through a GUI, which is to appear on the screen of the image display device 132, but not shown in the drawings (step 404). After the adjustment operation, the operator specifies a chip to be inspected in the wafer and a region to be inspected in the chip (step 405).

Subsequently, the operator opens a signal detection/charge control setup window in FIG. 6 on the screen of the image display device 132. The operator determines the conditions for charge control and signal detection through the window (step 406). First, the operator inputs the name of a condition file or selects a condition file stored in the storage section 127 through a condition-file specification box 601 to retrieve it. Secondly, a click of a display button 602 by the operator shows the conditions, such as landing energy of the signal-detection beam, probe current and surface electric field strength, on a signal-detection electron-optical-system condition setup field 603, while showing a number of a pattern used to apply charge-control beams and conditions of the pattern-selecting deflector and other components on a charge-control electron-optical-system condition setup field 605. The operator, if necessary, clicks an adjustment button 604 to display a setup window for conditions of the electron optical system for signal detection, and can again adjust the landing energy of the signal-detection beam, probe current and surface electric field strength when applying signal-detection beams. In addition, a click of the adjustment button 606 can invoke the window in FIG. 5 to adjust the conditions for applying charge-control beams. These steps make fine adjustments of the electron optical system and confirmation (step 407). When the operator clicks an OK button 607, the specified signal detection conditions and the charge control conditions are stored in a temporary storage of the storage section 127, thereby completing the signal detection/charge control conditions setup. The operator clicks an inspection button displayed on the image display device 132 afterwards to perform an inspection (step 408).

Figure 6:
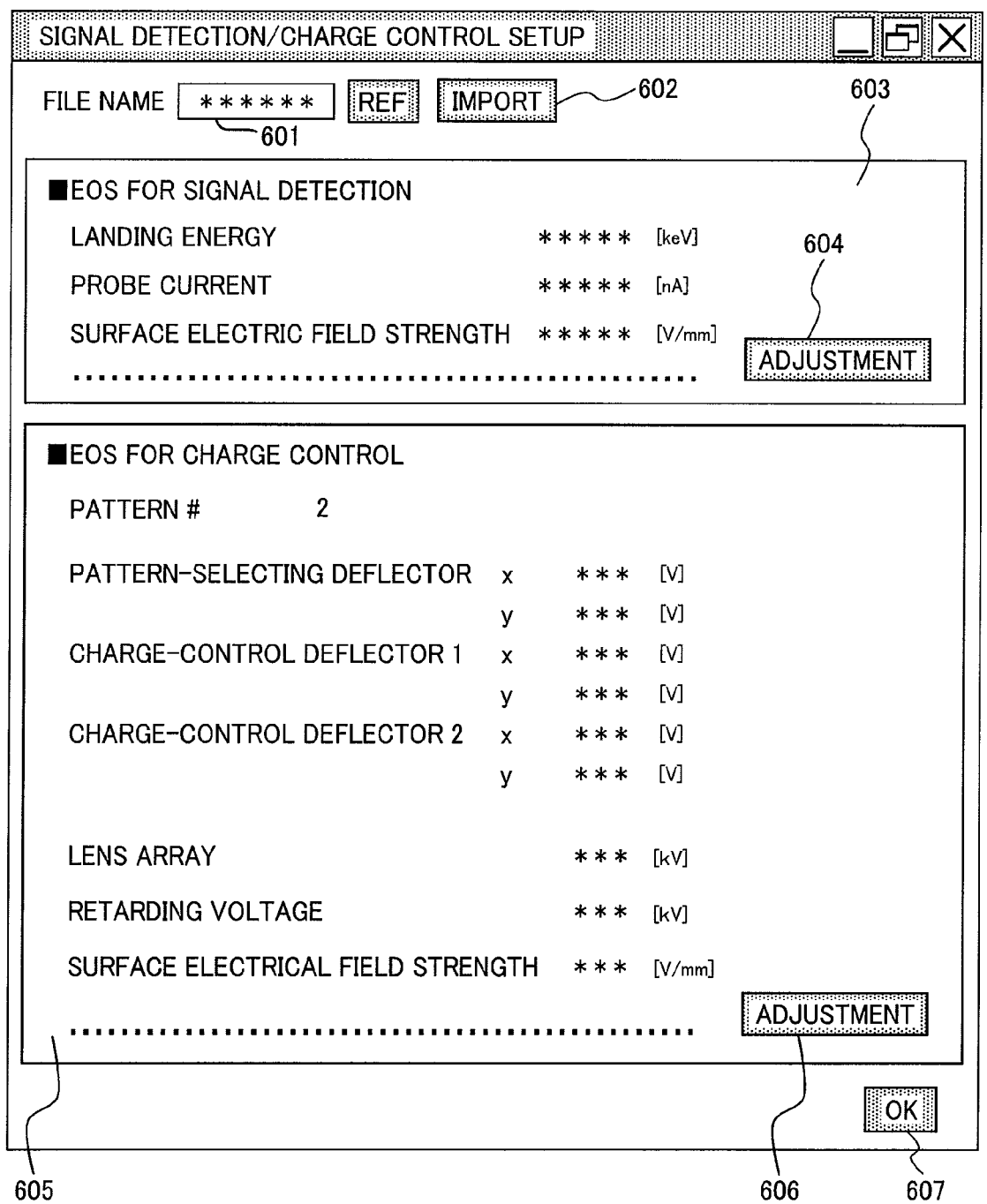
FIG. 6 illustrates a signal detection/charge control setup window in the first embodiment.
Figure 7A:
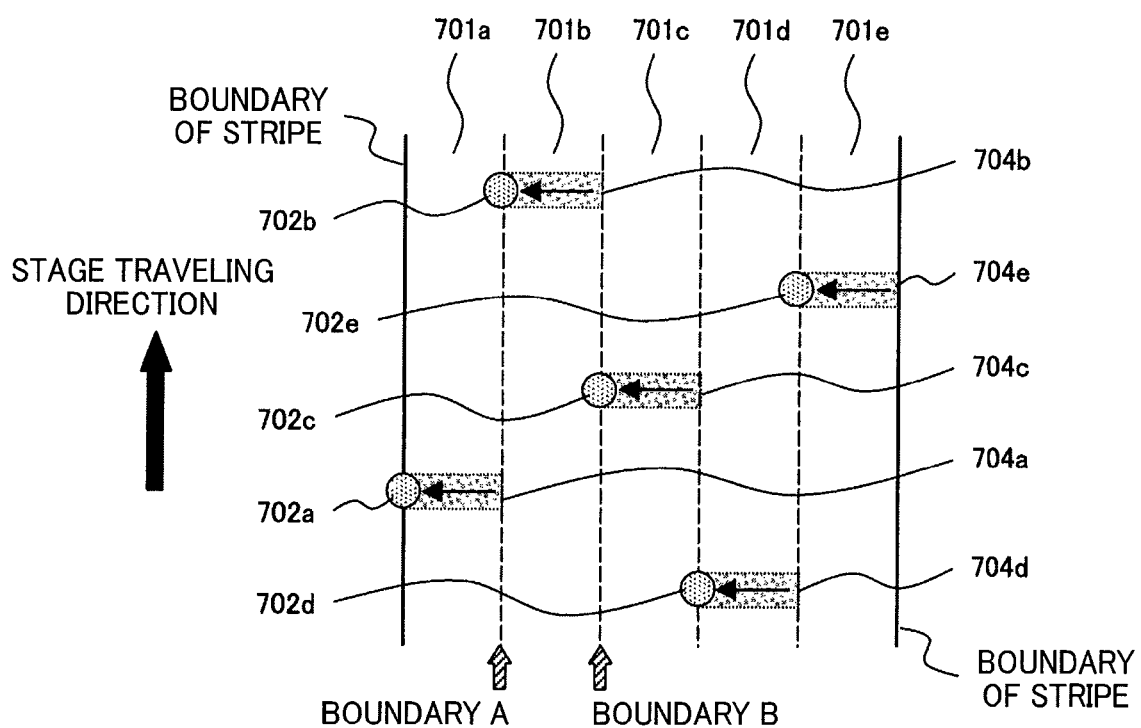
FIG. 7A illustrates a scanning operation by the charge-control beams in the first embodiment.
Figure 7B:
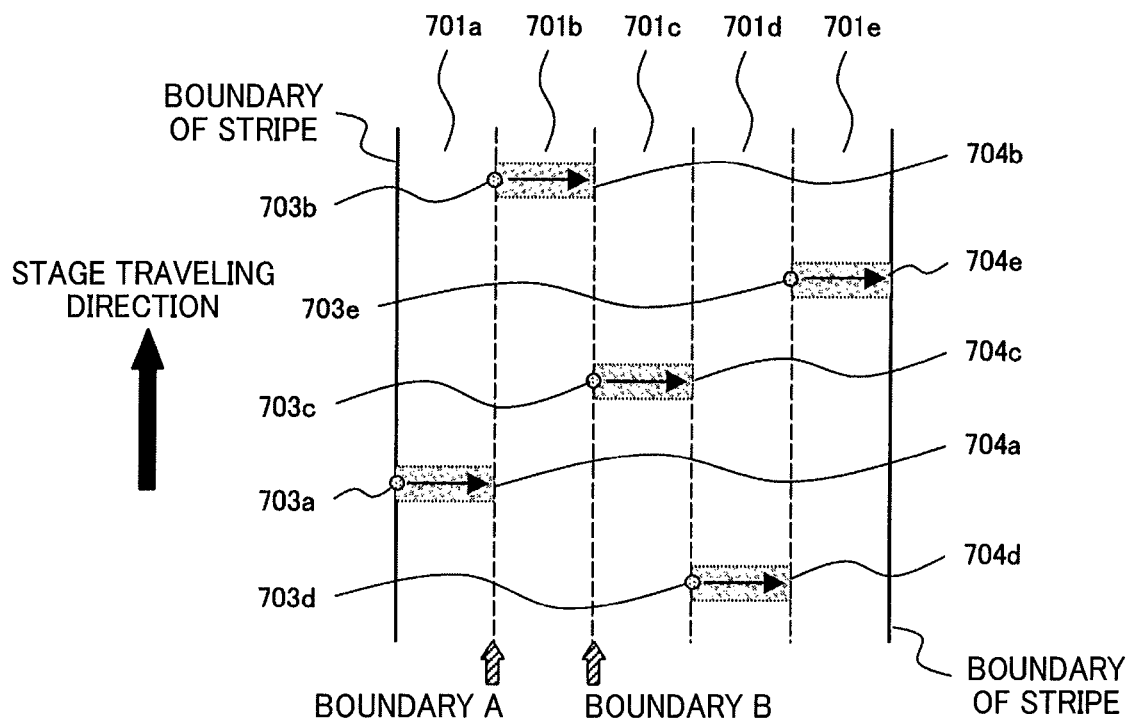
FIG. 7B illustrates a scanning operation by the signal-detection beams in the first embodiment.

With reference to FIGS. 7A and 7B, the operation of the apparatus when performing an inspection will be described. First, conditions for producing charge-control beams are set to the pattern-selecting deflector 109, lens array 112, charge-control deflectors 113a, 113b, and surface electric-field control electrode 118. At this time, the system controller 126 reads the charge-control electron-optical-system conditions set through the signal detection/charge control setup window in FIG. 6 from the temporary storage part of the storage section 127 and sends signals to the scanning signal generation device 130 and electron optical system control circuit 133 to set the desired conditions, thereby changing the conditions of the electron optical elements.

FIG. 7A illustrates a scanning operation by charge-control beams when the aperture pattern 202c in FIG. 2 is selected by the pattern-selecting deflector 109 during the charge-control beam illumination. In this scanning operation, five charge-control beams 702a to 702e are formed. Beam illumination regions 701a to 701e, which are defined by dividing one stripe into five, are scanned by the charge-control beams 702a to 702e, respectively, thereby scanning the entire stripe. Hereinafter, the boundary between the beam illumination regions 701a and 701b is referred to as boundary A, while the boundary between the beam illumination regions 701b and 701c is referred to as boundary B. In this embodiment, the five charge-control beams 702a to 702e are deflected in the same direction at the same angle by the scanning-beam deflector 117, and sweep from one boundary to the other boundary of each of the beam illumination regions 701a to 701e in the direction, for example, in this embodiment, from the boundary B to boundary A.

As described above, the regions scanned by the charge-control beams 702a to 702e bear desired electrical charges. The charged regions are hereinafter referred to as charge-controlled regions 704a to 704e. Although five multi-beams are used in this embodiment, any number of multi-beams is acceptable.

Upon completion of scanning with the charge-control beams 702a to 702e from one boundary to the other boundary of respective beam illumination regions 701a to 701e, the pattern-selecting deflector 109 and charge-control deflectors 113a, 113b stop their deflecting activities to apply signal-detection beams, and the conditions of the electron optical system, including the lens array 112 and surface electric-field control electrode 118, are changed to those for signal detection. As with the case of illumination with the charge-control beams, the system controller 126 reads the signal-detection electron-optical-system conditions set through the signal detection/charge control setup window from the temporary storage part in the storage section 127, and sends signals to the scanning signal generation device 130 and electron optical system control circuit 133 to set the desired conditions, thereby changing the conditions of the electron optical elements.

FIG. 7B illustrates a scanning operation by signal-detection beams when the aperture pattern 201 in FIG. 2 is selected during the signal-detection beam illumination. In this scanning operation, five signal-detection beams 703a to 703e are formed. The signal-detection beams 703a to 703e sweep from one boundary to the other boundary of respective beam illumination regions 701a to 701e in the direction from boundary A to boundary B for the purpose of detecting signals of the charge-controlled regions 704a to 704e. Specifically, in this embodiment, the scanning direction of the signal-detection beams is inverse to that of the charge-control beams. In this embodiment where the raster scanning is performed with the signal-detection beams, the wait time for a scanning signal to retract to the starting point of scanning can be used as scanning time by the charge-control beams, and therefore charge control and signal detection can be completed within approximately the same time period required for conventional raster scanning by signal-detection beams.

Upon completion of scanning with the signal-detection beams 703a to 703e, the conditions of the pattern-selecting deflector 109, lens array 112, charge-control deflectors 113a, 113b and surface electric-field control electrode 118 are again changed to the conditions for charge-control beam illumination, and the procedure is repeated in synchronization with scanning. As described above, the inspection apparatus in this embodiment with a continuously moving stage can perform successive scans of the beam illumination regions 701a to 701e through the aforementioned operations. After the end of the stripe is completely scanned, the stage 119 is controlled so that the next stripe is illuminated by a primary beam, and the next stripe is scanned by charge-control beams and signal-detection beams in the same manner. With the above-described method, a pattern inspection can be performed on the inspection regions of the wafer 122 from end to end.

The above-described method in this embodiment can provide an easily implementable structure, a reduction of time difference between charge-control beam illumination and signal-detection beam illumination to perform charge control and signal detection under optimal conditions, and improvement of defect detection sensitivity. An electric field controls the behavior of the secondary electrons, but also affects the signal-detection beams; however, because the charge control and signal detection are not performed simultaneously in this embodiment, the electric field, which pulls the secondary electrons back to the specimen, is not created during times when the signal-detection beams are being illuminated. The signal-detection beams that are not affected by the charge control therefore can detect defects with high accuracy. In addition, the wait time for the scanning signal to retract to the starting point of scanning can be used as scanning time by the charge-control beams, and therefore charge control and signal detection can be completed within approximately the same time period required for conventional raster scanning by the signal-detection beams.

The charge-control deflectors 113a, 113b have been described in this embodiment as deflectors for adjusting the positions where the charge-control beams 105a, 105b, 105c strike; however, they can be also used to adjust the positions where the signal-detection beams 104a, 104b, 104c strike. In addition, the aperture pattern 201 at the center of the aperture array shown in FIG. 2 has been described as a pattern for forming the signal-detection beams; however, this can be also used to form the charge-control beams. Alternatively, the aperture patterns 202a to 202h around the aperture pattern 201 can be used to form the signal-detection beams. For example, the selection of the aperture patterns 202b and 202c, each of their apertures being larger in size and allowing more electrons to pass therethrough in comparison with the aperture pattern 201, enables a multi-beam inspection with a large probe beam current. In this case, when the signal-detection electron optical system is adjusted, each element of the electron optical system is adjusted so that an appropriate aperture pattern is selected as a pattern for forming the signal-detection beams.

Embodiment 2

In Embodiment 1, switching between the illumination conditions of the charge-control beam and the illumination conditions of the signal-detection beam takes place in synchronization with scan signals to reduce the time difference from illumination by charge-control beams to illumination by signal-detection beams, thereby enabling an inspection with a wafer steadily charged. However, the embodiment may sometimes pose nonuniformity in image brightness and inspection sensitivity of every beam. To overcome the problem, the second embodiment provides an inspection method realizing uniform image brightness and inspection sensitivity.

Figure 8A:
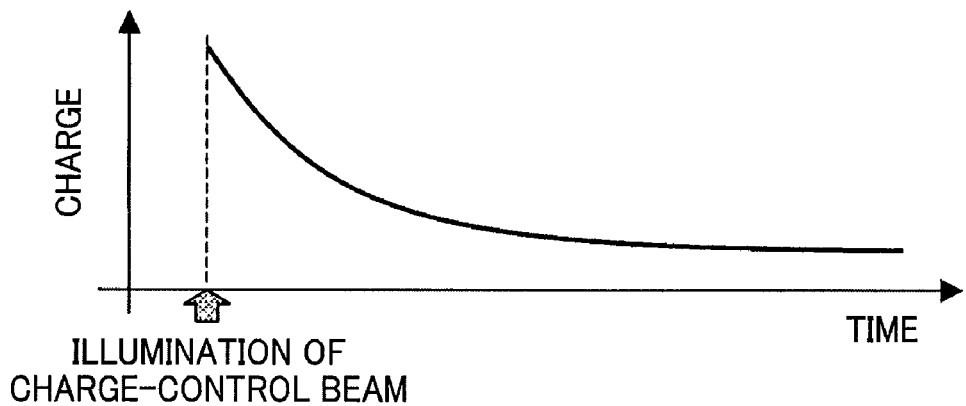
FIG. 8A illustrates time variations of charge from immediately after the charge-control beams illuminate the specimen in the first embodiment.

First of all, the reason why the image brightness and inspection sensitivity of every beam become nonuniform in Embodiment 1 will be described with reference to FIGS. 7A, 7B and FIGS. 8A, 8B. FIG. 8A illustrates time variations of the amount of charge at a charge-control beam illuminated part. The amount of charge increased by a charge-control beam gradually decreases with the passage of time. The reduction in charge amount expressed in a time scale differs from wafer to wafer. Since the image brightness and inspection sensitivity depend on the charge amount, if the time from illumination by the charge-control beams to illumination by the signal-detection beams is comparable with the time scale in which the amount of charge decreases, the image brightness and inspection sensitivity will be affected.

Figure 8B:
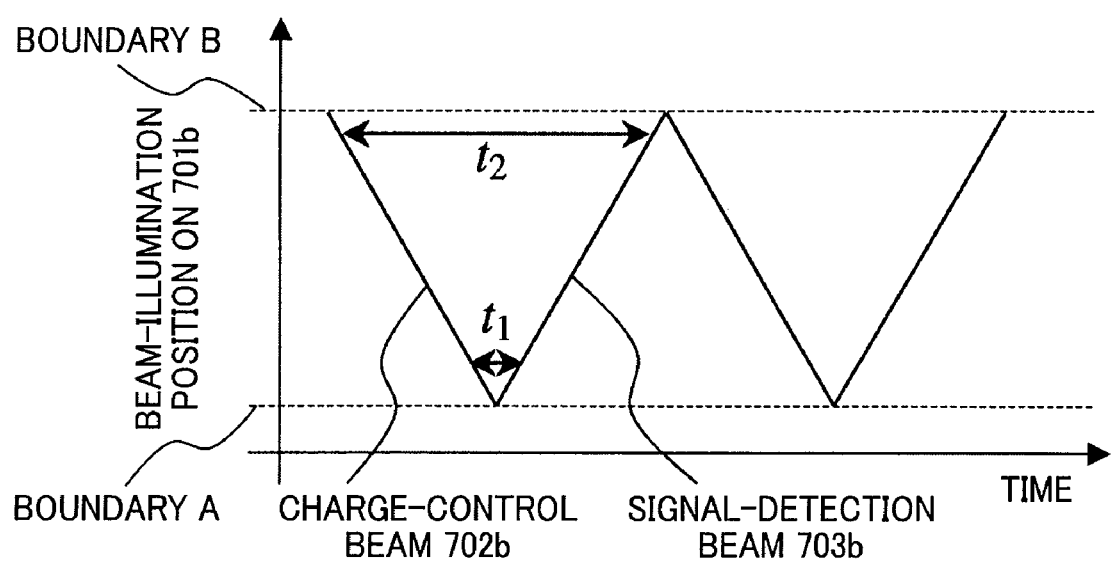
FIG. 8B illustrates time difference between charge-control beam illumination and signal-detection beam illumination in the first embodiment.

FIG. 8B illustrates the time-varying positions of a primary beam that scans the beam illumination region 701b in FIGS. 7A, 7B of Embodiment 1. Note that FIG. 8B has been prepared to describe the beam illumination region 701b, but the other beam illumination regions will be treated in the same manner.

As shown in FIG. 7A, the charge-control beam 702b sweeps from boundary B to boundary A. Subsequently, as shown in FIG. 7B, the signal-detection beam 703b sweeps from boundary A to boundary B. Letting the time interval from illumination by the charge-control beam to illumination by the signal-detection beam in the vicinity of boundary A be t1, the time interval from illumination by the charge-control beam to illumination by the signal-detection beam in the vicinity of boundary B be t2, t1≠t2 is established as shown in FIG. 8B, which shows that the amount of time elapsed from the illumination by the charge-control beam at the vicinity of boundary A differs from that at the vicinity of boundary B. As described with FIG. 8A, the charge on the wafer gradually decreases with the passage of time after the charge-control beam illumination, and therefore the amounts of charge in the vicinity of boundary A and boundary B during the illumination by the signal-detection beam are different from each other. Depending on the wafers and positions of the wafer, the signal-detection beams may illuminate regions with different amounts of charge in Embodiment 1, which causes nonuniform image brightness and inspection sensitivity.

Figure 8C:
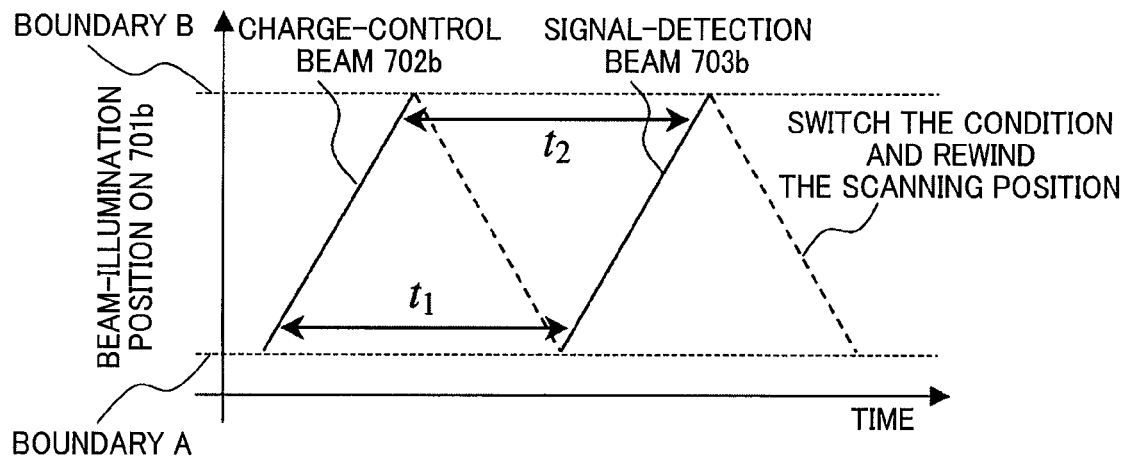
FIG. 8C illustrates time difference between charge-control beam illumination and signal-detection beam illumination in a second embodiment.
Figure 9A:
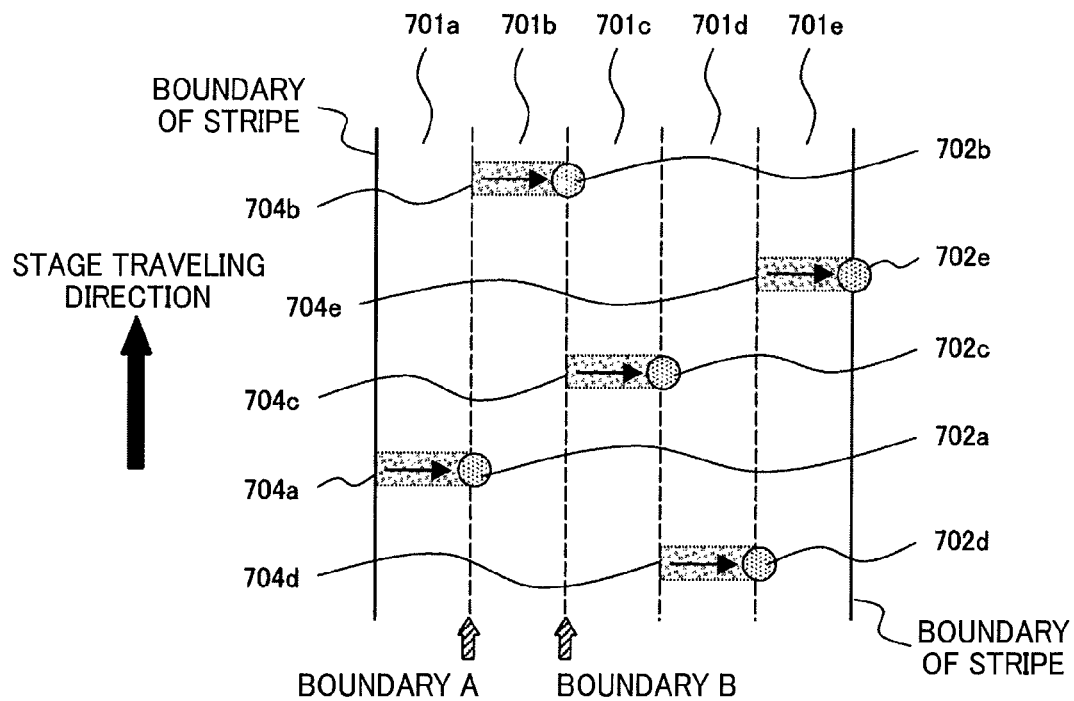
FIG. 9A illustrates a scanning operation by the charge-control beams in the second embodiment.
Figure 9B:
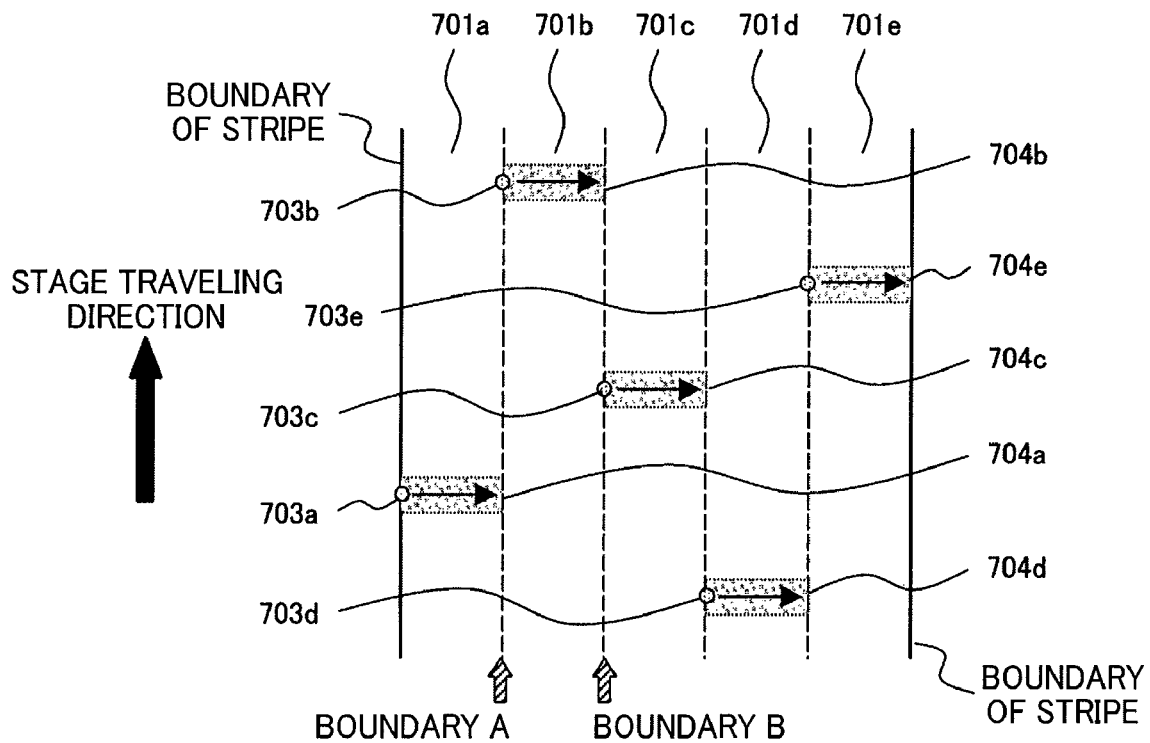
FIG. 9B illustrates a scanning operation by the signal-detection beams in the second embodiment.

For the purpose of addressing the problem, charge-control beams 702 and signal-detection beams 703 in this embodiment sweep in an identical direction for scanning. The method will be described with reference to FIG. 8C and FIGS. 9A, 9B. Since the configuration of the apparatus in this embodiment is the same as that of the Embodiment 1, only the different parts will be described. FIGS. 9A, 9B illustrate the scanning direction of charge-control beams 702a to 702e and signal-detection beams 703a to 703e in this embodiment. As shown in FIG. 9A, the charge-control beams 702a to 702e sweep from one boundary to the other boundary of the respective beam illumination regions 701a to 701e in the direction from boundary A to boundary B. This turns the beam illumination regions 701a to 701e into charge-controlled regions 704a to 704e. After scanning by the charge-control beams 702a to 702e is completed, the condition change required for illuminating signal-detection beams 703a to 703e affects the electron optical elements, and scanning signals retract to the starting point of scanning. Subsequently, as shown in FIG. 9B, the signal-detection beams 703a to 703e scan the charge-controlled regions 704a to 704e, respectively, in the direction from boundary A to boundary B. FIG. 8C illustrates the time-varying positions of a primary beam in the embodiment. In this embodiment, t1 is equal to t2, that is, the time periods from the charge-control beam illumination to the signal-detection beam illumination are all the same irrespective of positions illuminated by the beams. Since the time variations in the amount of charge depend on the elapsed time after application of the charge-control beams, the amounts of charge in inspection regions are uniform. Accordingly, uniformity of image brightness and inspection sensitivity can be maintained irrespective of the beam illumination position.

Embodiment 3

In Embodiments 1 and 2, the conditions for the charge-control beams 702a to 702e and the conditions for the signal-detection beams 703a to 703e are switched over every time the beams sweep from one boundary to the other boundary of the beam illumination regions 701a to 701e; however, every switching operation of the illumination conditions takes a few seconds. The methods of Embodiments 1 and 2 that involve frequent switching of the illumination conditions may sometimes cause a long inspection time. If, however, the wafer 122 can hold the charge roughly equal to or longer than the time required to scan a stripe, it is enough to switch the conditions between charge-control beam illumination and signal-detection beam illumination every time one stripe is scanned. In the third embodiment, the above-described two conditions are switched every time one stripe is scanned. The third embodiment can reduce the number of times to switch the illumination conditions and reduce the duration of an inspection compared with Embodiment 2. The configuration of the apparatus is the same as that of Embodiment 1 and only the different parts will be described.

FIG. 10 illustrates the travelling charge-control beams 702a to 702e and signal-detection beams 703a to 703e, viewed from the wafer 122, according to Embodiment 3. FIG. 10 represents the beams travelling relative to the movement of the wafer 122 mounted on the stage 119. First, as shown in FIG. 10A, the charge-control beams 702a to 702e scan one stripe in the upper direction in the drawing viewed from the wafer 122 to provide charge-controlled regions 704a to 704e. Second, as shown in FIG. 10B, the signal-detection beams 703a to 703e scan the stripe in the lower direction in the drawing viewed from the wafer 122 to scan the charge-controlled regions 704a to 704e. These scanning operations enable charge control and signal detection for one stripe. After the charge control and signal detection for one stripe are completed, the stage 119 is controlled in order to perform charge control and signal detection for the next stripe and the same operations as above are repeated. Accordingly, the regions within the wafer 122 to be inspected can be subjected to pattern inspection.

Figure 10C:
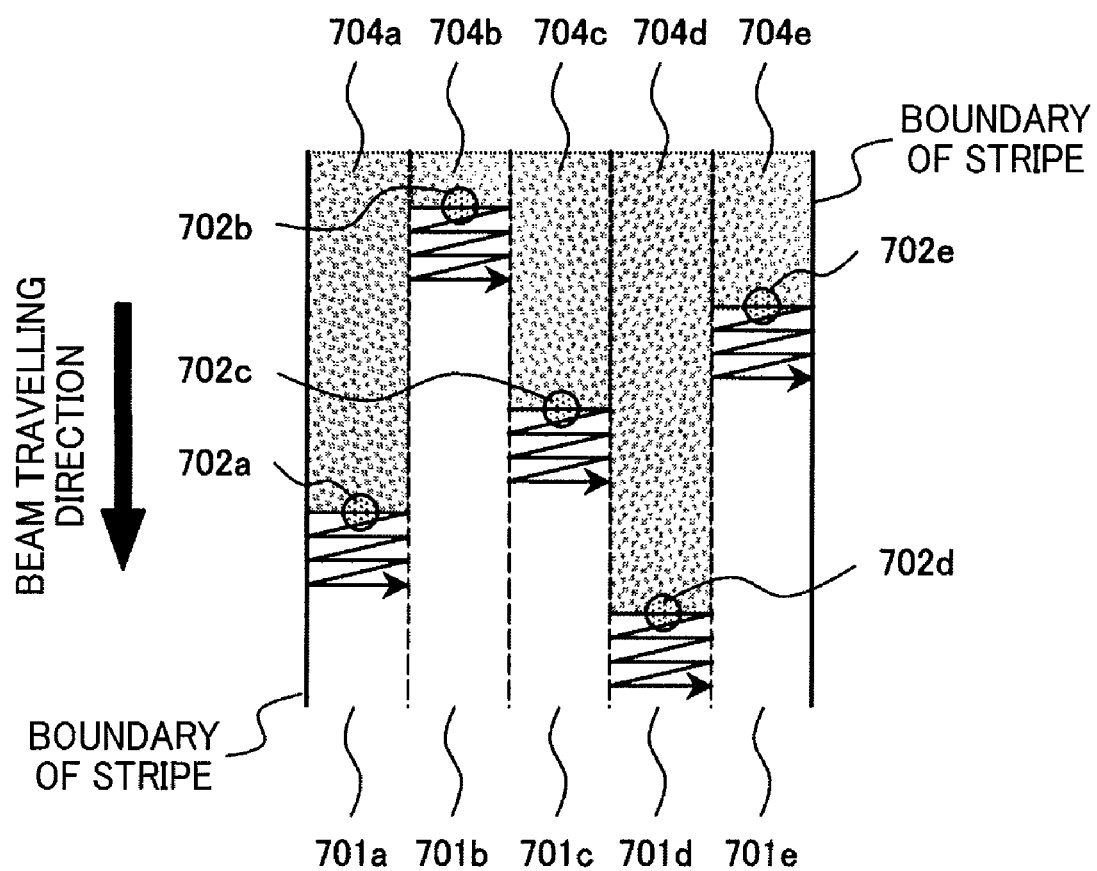
FIG. 10C illustrates a scanning operation by the charge-control beams in the third embodiment.

In this embodiment, the charge-control beams and signal-detection beams, when illuminating the wafer 122, travel in the opposite direction to each other as viewed from the wafer 122; however, the beams can be configured to travel in the same direction. Specifically, the charge-control beams can be set to travel downwardly in the drawing as shown in FIG. 10C and the signal-detection beams can be also set to travel downwardly in the drawing as shown in FIG. 10B to perform pattern inspection of the wafer 122.

Embodiment 4

In Embodiments 1 and 2, after one operation by the charge-control beams 702a to 702e to scan from one boundary to the other boundary of the beam illumination regions 701a to 701e to control the charge thereon, the illumination conditions are changed and the signal-detection beams 703a to 703e scan the charge-controlled regions to detect signals. Alternatively, in Embodiment 3, after one operation by the charge-control beams 702a to 702e to scan one stripe to control the charge thereon, the signal-detection beams 703a to 703e scan the stripe to detect signals.

On the contrary, in the fourth embodiment, after multiple scanning operations by the charge-control beams 702a to 702e, the signal-detection beams 703a to 703e perform scanning. This embodiment also enables inspection in a highly charged state. Note that the apparatus configuration of this embodiment is also the same as that of Embodiment 1.

Figure 11:
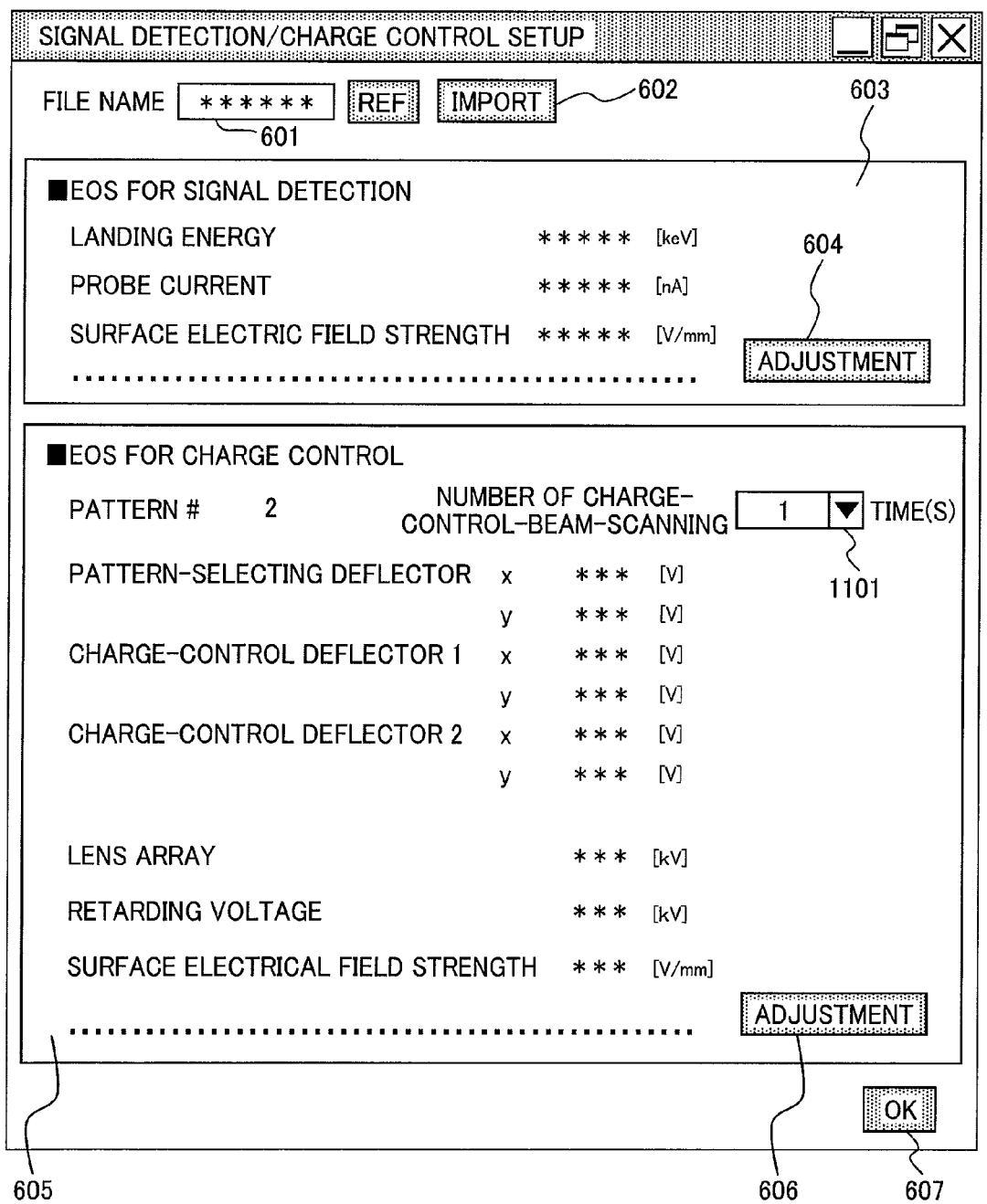
FIG. 11 shows a signal detection/charge control setup window in a fourth embodiment.

FIG. 11 shows a signal detection/charge control setup window, according to Embodiment 4, that is different from the signal detection/charge control setup window in FIG. 6 in that a charge-control-beam-scanning setup box 1101 is added. An operator can perform scanning with the charge-control beams multiple times by inputting the number of scanning operations in the box to set the number of charge-control beam scanning 1101.

In this embodiment, the aperture pattern can be changed to another while the charge-control beams are applied multiple times. For example, subsequent to selecting an aperture pattern 202b to illuminate charge-control beams and in turn an aperture pattern 202c to illuminate charge-control beams, signal-detection beams can be applied.

Embodiment 5

Through the above-described Embodiments 1 to 4, the provided aperture array 111 and lens array 112 have multiple aperture patterns, one of which is selected by the pattern-selecting deflector 109. The aperture patterns and optical conditions for charge control and signal detection are switched to control charge and observe specimens. The fifth embodiment presents a multi-beam type electron beam inspection apparatus with a single aperture pattern that will be described below.

Figure 12:
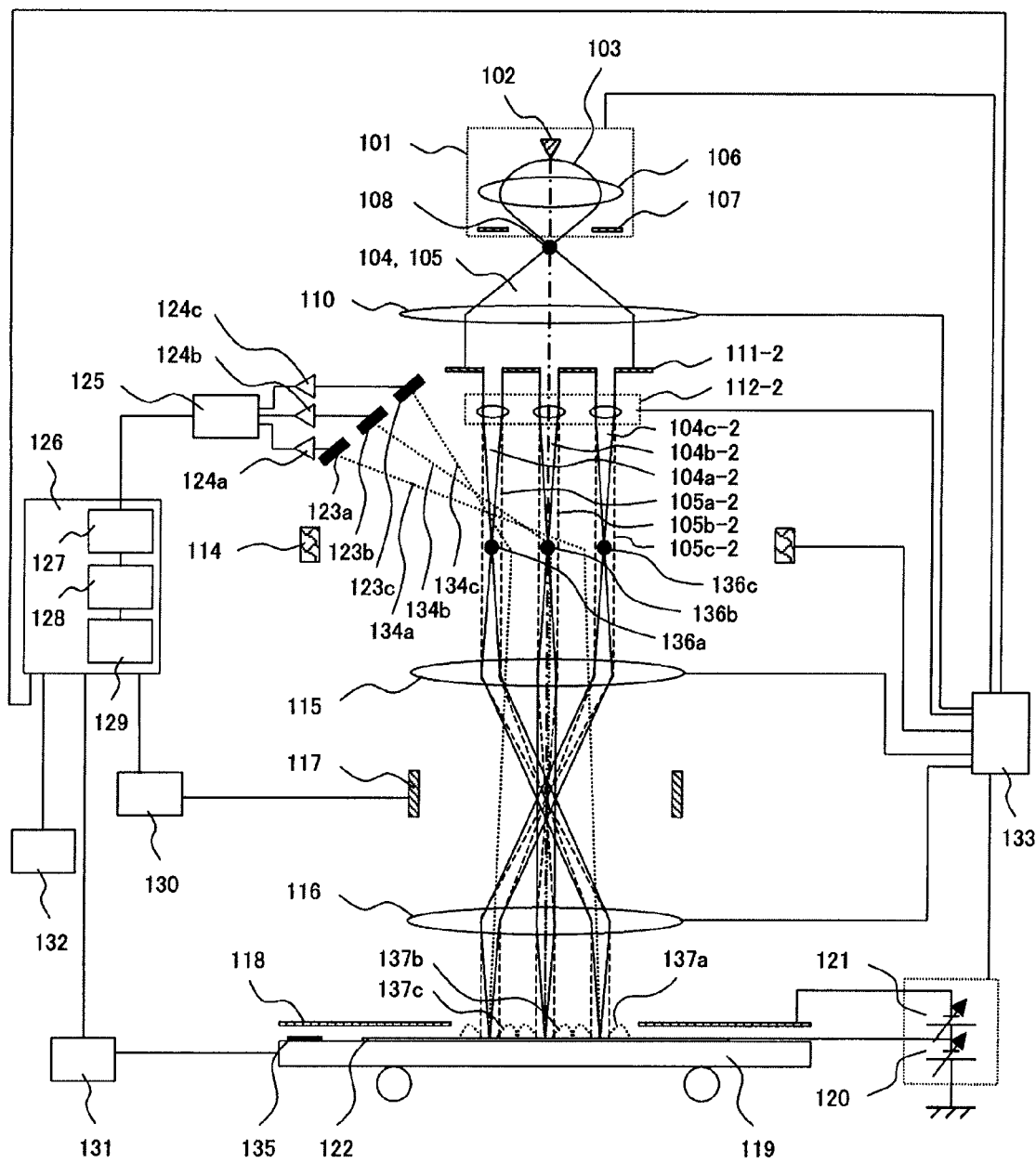
FIG. 12 is a schematic diagram of an electron beam inspection apparatus of a fifth embodiment.

FIG. 12 shows a multi-beam type electron beam inspection apparatus according to Embodiment 5. Unlike the multi-beam type electron beam inspection apparatus in FIG. 1, an aperture array 111-2 and lens array 112-2 have a single aperture pattern, respectively, and therefore it is no necessary to select one from multiple patterns nor to provide a pattern-selecting deflector 109 and charge-control deflectors 113a, 113b. The aperture pattern of the aperture array 112-2 can be something similar to, for example, the aperture pattern 201 in FIG. 2. In this case, signal-detection beams 104a-2, 104b-2, 104c-2 formed to illuminate a specimen to detect signals are to be identical to the signal-detection beams 104a, 104b, 104c in FIG. 1, respectively. Note that 105a-2, 105b-2, 105c-2 in FIG. 12 denote charge-control beams formed to illuminate the specimen to control the charge thereon.

The factors that need to be changed at the time of switching between charge control and signal detection in this embodiment include the voltage value of the lens array 112-2 and surface electric-field control electrode 118 and the retarding voltage. Therefore, charge control and signal detection can be achieved with easy implementation and control relative to Embodiments 1 to 4.

Specifically, according to Embodiment 5, changing only the voltage values of the lens array 112 and surface electric-field control electrode 118 and the retarding voltage at the times of charge control and signal detection allows switchover between the charge-control beams 105a-2, 105b-2, 105c-2 and signal-detection beams 104a-2, 104b-2, 104c-2 in FIG. 12.

Industrial Applicability

The present invention can be utilized as a charged particle beam applied apparatus, such as an inspection apparatus and measurement apparatus, used in manufacturing processes of semiconductors and magnetic disks.

Reference Signs List

101: electron gun; 102: electron source; 103: primary beam; 104: signal-detection beam; 104a: signal-detection beam; 104b: signal-detection beam; 104c: signal-detection beam; 105: charge-control beam; 105a: charge-control beam; 105b: charge-control beam; 105c: charge-control beam; 106: magnetic lens; 107: anode; 108: first electron source image; 109: pattern-selecting deflector; 110: magnetic lens; 111: aperture array; 112: lens array; 113a: charge-control deflector; 113b: charge-control deflector; 114: beam separator; 115: magnetic lens; 116: objective lens; 117: scanning-beam deflector; 118: surface electric-field control electrode; 119: stage; 120: retarding power supply; 121: surface electric-field control power supply; 122: wafer; 123a: secondary electron detector; 123b: secondary electron detector; 123c: secondary electron detector; 124a: amplifier circuit; 124b: amplifier circuit; 124c: amplifier circuit; 125: A/D converter; 126: system controller; 127: storage section; 128: operating section; 129: defect determination section; 130: scanning signal generation device; 131: stage control device; 132: image display device; 133: electron optical system control circuit; 134a: secondary electron; 134b: secondary electron; 134c: secondary electron; 135: reference mark; 136a: second electron source image; 136b: second electron source image; 136c: second electron source image; 137a: secondary electron; 137b: secondary electron; 137c: secondary electron; 201: aperture pattern; 202a: aperture pattern; 202b: aperture pattern; 202c: aperture pattern; 202d: aperture pattern; 202e: aperture pattern; 202f: aperture pattern; 202g: aperture pattern; 202h: aperture pattern; 501: condition-file specification box; 502: aperture-array-condition setup field; 503: illumination-condition selection box; 504a: pattern-selecting-deflector setup box; 504b: pattern-selecting-deflector setup box; 505a: charge-control-deflector setup box; 505b: charge-control-deflector setup box; 505c: charge-control-deflector setup box; 505d: charge-control-deflector setup box; 506: lens-array setup box; 507: retarding-voltage setup box; 508: surface-electrical-field control-voltage setup box; 509: save-as button; 510: save button; 511: quit button; 512: charge-control-beam illumination-condition setup field; 601: condition-file specification box; 602: display button; 603: signal-detection electron-optical-system condition setup field; 604: adjustment button; 605: charge-control electron-optical-system condition setup field; 606: adjustment button; 607: OK button; 701a: beam illumination region; 701b: beam illumination region; 701c: beam illumination region; 701d: beam illumination region; 701e: beam illumination region; 702a: charge-control beam; 702b: charge-control beam; 702c: charge-control beam; 702d: charge-control beam; 702e: charge-control beam; 703a: signal-detection beam; 703b: signal-detection beam; 703c: signal-detection beam; 703d: signal-detection beam; 703e: signal-detection beam; 704a: charge-controlled region; 704b: charge-controlled region; 704c: charge-controlled region; 704d: charge-controlled region; 704e: charge-controlled region; 1101: charge-control-beam-scanning setup box.

The invention claimed is:

1. A charged particle beam applied apparatus comprising:
a charged particle source that produces charged particles;
a primary electron optical system that includes an illumination-system separation unit separating the charged particles produced by the charged particle source into a plurality of charged particle beams, one or more lenses used to apply the plurality of charged particle beams onto a specimen, and a scanning-beam deflector causing the plurality of charged particle beams to scan the specimen;
a signal detecting unit that detects individual secondary charged particle beams produced at a plurality of positions on the specimen by illuminating the specimen with the plurality of charged particle beams;
a secondary electron optical system that guides the secondary charged particle beams to the signal detecting unit;
a movable stage on which the specimen is mounted; and
a control unit that controls the switching times of charge-control beam illumination and signal-detection beam illumination, the charge-control beam illumination carried out for negatively charging the specimen by illuminating the specimen with a plurality of charge-control charged particle beams, and the signal-detection beam illumination carried out for detecting signals from the specimen by illuminating the specimen with a plurality of signal-detection charged particle beams,
wherein the control unit controls optical conditions of the primary electron optical system to switch between the charge-control beam illumination and the signal-detection beam illumination, and
wherein the primary electron optical system further includes a first deflector disposed between the charged particle source and the illumination-system separation unit, and the control unit controls the first deflector to deflect the charged particles so that the charged particles selectively pass through a part of the illumination-system separation unit to form the charge-control charged particle beams or the signal-detection charged particle beams.

2. The charged particle beam applied apparatus according to claim 1, wherein
the primary electron optical system further includes a second deflector that causes the charge-control charged particle beams and the signal-detection charged particle beams from the illumination-system separation unit to illuminate any positions on the specimen.

3. The charged particle beam applied apparatus according to claim 2, wherein
the control unit controls the first deflector and the second deflector in synchronization with each other.

4. The charged particle beam applied apparatus according to claim 1, wherein
the illumination-system separation unit includes an aperture array with a plurality of aperture patterns, and the control unit causes the first deflector to select one of the plurality of aperture patterns to form the charge-control charged particle beams or the signal-detection charged particle beams.

5. The charged particle beam applied apparatus according to claim 1, wherein
the illumination-system separation unit includes an aperture array with a single aperture pattern that separates the charged particles into the plurality of charged particle beams.

6. A charged particle beam applied apparatus comprising:
a charged particle source that produces charged particles;
a primary electron optical system that includes an illumination-system separation unit separating the charged particles produced by the charged particle source into a plurality of charged particle beams, one or more lenses used to apply the plurality of charged particle beams onto a specimen, and a scanning-beam deflector causing the plurality of charged particle beams to scan the specimen;
a signal detecting unit that detects individual secondary charged particle beams produced at a plurality of positions on the specimen by illuminating the specimen with the plurality of charged particle beams;
a movable stage on which the specimen is mounted;
a surface electric-field control unit that controls the surface electric field of the specimen; and
a control unit that controls optical conditions of the first electron optical system and the surface electric-field control unit and controls the switching times of charge-control beam illumination and signal-detection beam illumination, the charge-control beam illumination carried out for charging the specimen by illuminating the specimen with a plurality of charge-control charged particle beams, and the signal-detection beam illumination carried out for illuminating the specimen with a plurality of signal-detection charged particle beams,
wherein the primary electron optical system further includes a first deflector between the charged particle source and the illumination-system separation unit, and the first deflector deflects the charged particles so as to select a part of the illumination-system separation unit to form the charge-control charged particle beams or the signal-detection charged particle beams.

7. The charged particle beam applied apparatus according to claim 6, wherein
the primary electron optical system further includes a second deflector that causes the charge-control charged particle beams and the signal-detection charged particle beams from the illumination-system separation unit to illuminate any positions on the specimen.

8. The charged particle beam applied apparatus according to claim 7, wherein
the control unit controls the first deflector and the second deflector in synchronization with each other.

9. The charged particle beam applied apparatus according to claim 7, wherein
the control unit controls the surface electric-field control unit to negatively charge or positively charge the specimen.

10. The charged particle beam applied apparatus according to claim 6, wherein
the illumination-system separation unit includes an aperture array with a plurality of aperture patterns, and the control unit controls the first deflector to select one of the plurality of aperture patterns.

11. The charged particle beam applied apparatus according to claim 6, wherein
the illumination-system separation unit includes an aperture array with a single aperture pattern that separates the charged particles into the plurality of charged particle beams.

12. A charged particle beam applied apparatus comprising:
a charged particle source that produces charged particles;
an illumination-system separation unit that includes a plurality of aperture patterns and separates the charged particles produced by the charged particle source into a plurality of charged particle beams;
a primary electron optical system that includes a pattern-selecting deflector disposed between the charged particle source and the illumination-system separation unit, the pattern-selecting deflector applying the charged particles from the charged particle source to one of the plurality of aperture patterns, one or more lenses used to apply the plurality of charged particle beams onto a specimen, and a scanning-beam deflector causing the plurality of charged particle beams to scan the specimen;
a signal detecting unit that detects individual secondary charged particle beams produced at a plurality of positions on the specimen by illuminating the specimen with the plurality of charged particle beams;
a secondary electron optical system that guides the secondary charged particle beams to the signal detecting unit;
a movable stage on which the specimen is mounted;
a surface electric-field control unit that controls the surface electric field of the specimen; and
a control unit that controls optical conditions of the first electron optical system and the surface electric-field control unit and controls switching between charge-control beam illumination and signal-detection beam illumination, the charge-control beam illumination carried out for charging the specimen with a plurality of charge-control charged particle beams, and the signal-detection beam illumination carried out for detecting signals from the specimen.

13. The charged particle beam applied apparatus according to claim 12, wherein
at the time of charge-control beam illumination, the control unit controls the surface electric-field control unit to negatively charge the specimen.

14. The charged particle beam applied apparatus according to claim 12, wherein
at the time of charge-control beam illumination, the control unit controls the surface electric-field control unit to positively charge the specimen or eliminate the charge.

15. The charged particle beam applied apparatus according to claim 12, wherein
the plurality of aperture patterns include different aperture patterns that select the plurality of charged particle beams for the charge-control beam illumination or the signal-detection beam illumination.

16. The charged particle beam applied apparatus according to claim 12, wherein
the control unit includes a storage section that stores the optical conditions of the primary electron optical system.

17. The charged particle beam applied apparatus according to claim 12, wherein
the control unit controls the scanning-beam deflector of the primary electron optical system, and
the plurality of charged particle beams used for the charge-control beam illumination and the plurality of charged particle beams used for the signal-detection beam illumination travel in the opposite directions to each other or in the same direction.

* * * * *